United States Patent
Gosieski, Jr. et al.

(10) Patent No.: US 10,606,312 B2
(45) Date of Patent: *Mar. 31, 2020

(54) SYSTEM, METHOD AND DEVICE FOR DESIGNING, MANUFACTURING, AND MONITORING CUSTOM HUMAN-INTERFACING DEVICES

(71) Applicant: JumpStartCSR, Inc., Seattle, WA (US)

(72) Inventors: George John Gosieski, Jr., Seattle, WA (US); George Jeongsoo Gosieski, Seattle, WA (US); Aaron Zev Lichtner, Seattle, WA (US)

(73) Assignee: JumpStartCSR, Inc., Seattle, WA (US)

( * ) Notice: Subject to any disclaimer, the term of this patent is extended or adjusted under 35 U.S.C. 154(b) by 295 days.

This patent is subject to a terminal disclaimer.

(21) Appl. No.: 15/726,702

(22) Filed: Oct. 6, 2017

(65) Prior Publication Data

US 2018/0046215 A1 Feb. 15, 2018

Related U.S. Application Data

(63) Continuation of application No. 15/056,076, filed on Feb. 29, 2016, now Pat. No. 9,817,439.

(51) Int. Cl.
| | |
|---|---|
| *G06F 30/17* | (2020.01) |
| *G06F 1/16* | (2006.01) |
| *G06F 3/01* | (2006.01) |
| *B33Y 50/02* | (2015.01) |
| *G06F 3/14* | (2006.01) |

(52) U.S. Cl.
CPC .............. *G06F 1/163* (2013.01); *B33Y 50/02* (2014.12); *G06F 3/011* (2013.01); *G06F 30/17* (2020.01); *G06F 3/14* (2013.01); *G06F 2203/0382* (2013.01); *G06F 2203/0384* (2013.01); *G09G 2370/16* (2013.01)

(58) Field of Classification Search
None
See application file for complete search history.

(56) References Cited

U.S. PATENT DOCUMENTS

| | | | | |
|---|---|---|---|---|
| 2006/0070260 | A1* | 4/2006 | Cavanagh | A43B 17/00 36/44 |
| 2006/0253011 | A1* | 11/2006 | Edmonson | A61B 5/14521 600/346 |
| 2007/0163147 | A1* | 7/2007 | Cavanagh | A43B 17/00 36/44 |
| 2010/0004566 | A1* | 1/2010 | Son | A43B 17/00 600/592 |
| 2011/0080290 | A1* | 4/2011 | Baxi | A61B 5/1116 340/573.1 |
| 2012/0276999 | A1* | 11/2012 | Kalpaxis | A61B 5/0002 463/36 |
| 2013/0185003 | A1* | 7/2013 | Carbeck | A43B 3/0005 702/41 |
| 2014/0316711 | A1* | 10/2014 | Everson | A61F 5/14 702/19 |
| 2015/0100105 | A1* | 4/2015 | Kiani | A61B 5/6898 607/49 |

(Continued)

*Primary Examiner* — Kibrom K Gebresilassie
(74) *Attorney, Agent, or Firm* — Williams Mullen; Thomas F. Bergert

(57) ABSTRACT

A system, method and device employs sensor arrangements and an e-system in designing, manufacturing, and monitoring custom human-interfacing devices.

19 Claims, 22 Drawing Sheets

(56) References Cited

U.S. PATENT DOCUMENTS

| | | | | |
|---|---|---|---|---|
| 2015/0119667 A1* | 4/2015 | Reihman | A61B 5/6802 | |
| | | | 600/365 | |
| 2015/0359457 A1* | 12/2015 | Blumenthal | A63F 13/50 | |
| | | | 73/172 | |
| 2016/0058364 A1* | 3/2016 | Ionescu | A61B 5/443 | |
| | | | 600/301 | |
| 2016/0080550 A1* | 3/2016 | Kwon | H04W 4/90 | |
| | | | 455/404.2 | |
| 2016/0183872 A1* | 6/2016 | Horst | A61F 5/0102 | |
| | | | 600/592 | |
| 2016/0187965 A1* | 6/2016 | Park | G06F 3/011 | |
| | | | 345/156 | |
| 2016/0256741 A1* | 9/2016 | Holma | G06F 19/3481 | |
| 2017/0190121 A1* | 7/2017 | Aggarwal | B33Y 50/02 | |
| 2017/0249417 A1* | 8/2017 | Gosieski, Jr. | G06F 30/17 | |

* cited by examiner

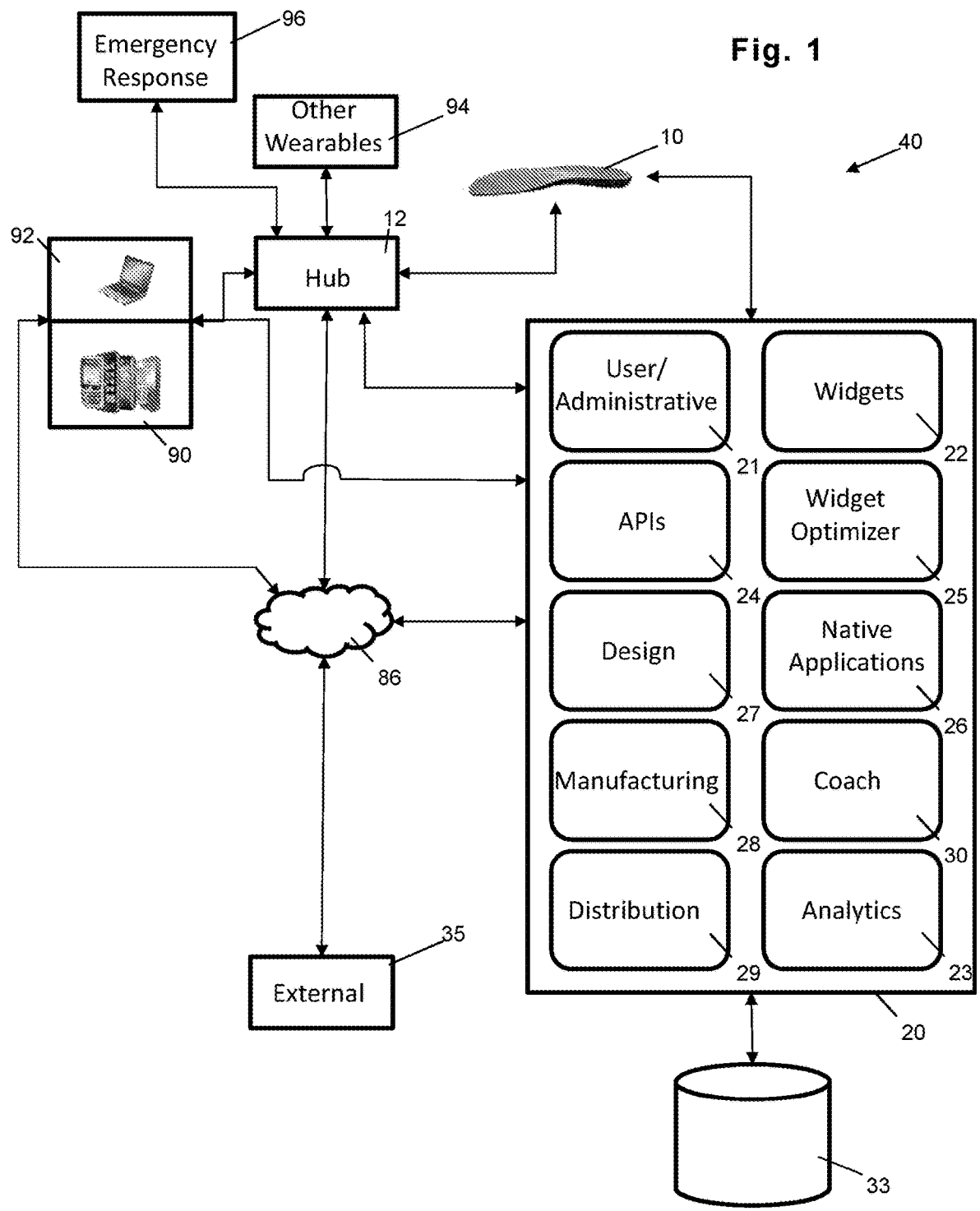

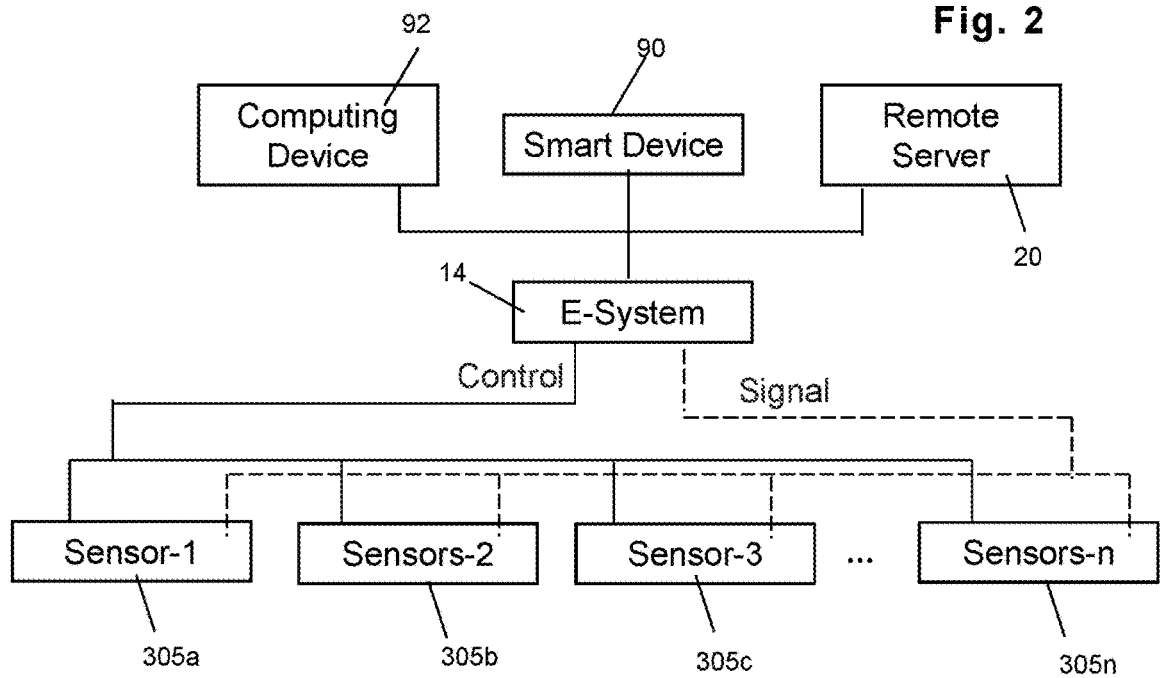
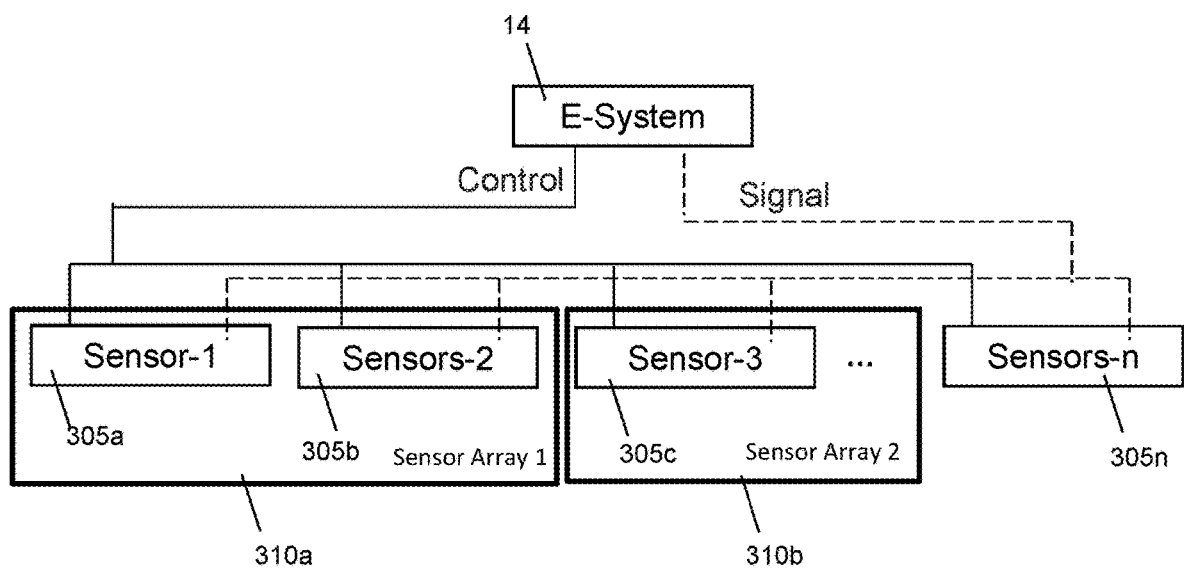
Fig. 3

SYSTEM, METHOD AND DEVICE FOR DESIGNING, MANUFACTURING, AND MONITORING CUSTOM HUMAN-INTERFACING DEVICES

TECHNICAL FIELD

The present invention relates to human-interfacing devices, and more particularly, to a system, method and device for designing, manufacturing and monitoring custom human-interfacing devices.

BACKGROUND ART

Human-interfacing devices (HIDs) are either mass produced over-the-counter products or custom-built products. The former involve little or no consideration of an individual's unique musculoskeletal needs and the latter require a time consuming, complex and costly process. Both approaches assume a static system with little consideration of system dynamics such as changes in the individual and activities. The traditional design process does not effectively address the human body's free or desired motion and can create an unnecessary and unproductive dependency on a given HID. In the specific field of orthotic insoles, for example, incorrectly fitting orthotic insoles can result in a dependency on the orthotic and can promote atrophy of the foot muscles.

In addition to the above, custom HIDs are expensive and complex to produce. For example, many custom orthotic insoles can cost at least several hundred dollars and average two to three months to obtain. Additional time and cost can be incurred through various referrals to podiatrists and fine tuning of the custom orthotic. Typical fine tuning processes are more art than science, and primarily rely on the user's input, the podiatrist's abilities, and the orthotic's propensity for modification. Over-the-counter (OTC) HIDs such as orthotics are typically much less effective than custom HIDs. While OTC orthotics are generally easier to obtain, assessing the need, finding a suitable orthotic, and insuring that they do not cause collateral damage are essentially impossible.

Additionally, HIDs are inherently ambiguous. There is no verifiable way to know if they are working, to what degree, and for how long. Custom orthotics, for example, rely on multiple professionals, their training and experience, and their level of engagement. The bio-mechanic assessment is performed in a clinical environment, prone to interpretation, dependent on the patient performing as if in their natural environment, and does not consider the patient's shoes or changes in physiology, for example. Additionally, the hand-off to a third party (e.g., pedorthist) increases the risk of error based on interpretation and missing context. While a well-made orthotic insole can have a long lifespan, for example, it exists in a dynamic system affected by shoe wear, changes in physiology, and activity which receive little, if any, consideration. This typically causes the orthotic not to perform as expected and can potentially contribute to repetitive stress injuries, foot muscle atrophy, and less than optimal performance.

In terms of assessment, a typical assessment for determining the need for and design of an orthotic insole, for example, can include a biomechanical and/or full gait analysis involving one or more methods, such as observation and manual measurements, pressure mapping, videography, photogrammetry, digital scanning, molds, and casts, where pressure mapping can be accomplished through static pressure plates, in-shoe pressure sensors, and/or other wearables. Assessments for other HIDs can involve similar analyses.

In addition to the above, current wearable devices, unless costing thousands of dollars, do not provide clinical grade data and insight from that data, and even the more expensive systems do not track all the needed parameters. They do not design and monitor HIDs, any related HID system or the effect of physical changes in the user. They do not account for user physiology, environment, activity, equipment like shoes, performance, and form, for example. They also do no optimize performance in real time, measure exercise effectiveness, predict repetitive stress injuries or identify functionally fitting equipment, apparel or other related devices. They do not connect health-wellness-fitness (HWF) professionals with their patients/clients or let users share their data with HWF professionals and enable HWF professionals to create custom notifications and enhance their diagnostic and treatment capabilities. They further do not provide telemetry, for example, in conjunction with telemedicine and sports applications.

SUMMARY OF INVENTIVE ASPECTS

In various embodiments, the present invention provides a system, method and device for designing, manufacturing and monitoring custom HIDs. In various embodiments, the system according to the present invention gathers and stores biometric and biomechanical data via a remote device, which can be worn by an individual or placed on an HID, and transmits the data such that it can be processed on a mobile and/or smart device in part or in total. The data from the wearable device or HID can be transmitted directly to a mobile communications device, computer, and/or smart device, indirectly such as through a gateway, or from a cloud-based server, for example. The data from the wearable device or HID can also be transmitted directly or indirectly via a gateway (including wireless transceiver and router, for example, where the gateway may be a part of the wearable device or independent of the wearable device), mobile device, smart device or computer to a server for further processing, storage in a database, and/or use by one or more expert systems such as provided in accordance with aspects of the present invention. In various embodiments, an HID can be designed and produced in accordance with the present invention such as personally wearable HIDs (e.g., shoes, socks and other apparel), equipment (e.g., athletic equipment, golf or tennis racket grips, keyboards, saddles, ice skates, helmets), tools (e.g., construction and gardening handles or attachments for handles) and other HIDs.

Aspects of the present invention assist with: preventing musculoskeletal injuries, predicting repetitive stress injuries; accelerating rehabilitation; improving the effectiveness of exercises and training; optimizing performance during competitive and non-competitive events; identifying functionally fitting apparel and equipment, including shoes and orthotics, for example; providing telemedicine and telemetry connecting health-wellness-fitness (HWF) professionals with users, giving them access to real world data, analytics, and the ability to select parameters and set parameter notification thresholds providing a continuous connection to users, including access to big data analytics and creating insights to augment diagnostic and treatment capabilities; expand the capabilities of evidence-based care; and optimizing a distributed supply chain based on a manufacturing paradigm where analytics identify the closest or most suitable available printer to a customer based on customer convenience and minimal cycle time, distribution cost, and environmental concerns. In various embodiments, the system consists of a modular HID, an expert system, groupware, and a manufacturing system. The expert system according to embodiments of the present invention can employ an electronic sub-system ("e-system") and sensors associated with the HID, for example.

In various specific embodiments, a modular orthotic insert according to aspects of the present invention consists of a footbed interacting with and/or containing an electronic sub-system and sensors, and a modular replaceable orthotic/insole that can be worn with or without the electronic footbed or e-system module as described herein. The modular insert is a wearable sensor system used to gather and share biomechanical, kinematic and biometric data and fits inside a user's shoe replacing their existing insole. The footbed is the lower portion of the insole and contains the majority or all of the electronics required for the wearable to collect and transmit data. The orthotic/insole is a custom or semi-custom part which forms the interface between the user's foot and the electronic footbed. The orthotic/insole may or may not have electronics in or on it. Alternatively, the e-system can be a removable cartridge similar to that of an SD card or similar format embedded in the side of the insert under the arch support and the sensor array mounted to the surface of the orthotic between the orthotic and orthotic cover. The sensors connect to the e-system through the structure of the orthotic or conduits specifically designed for this purpose and the purpose of aligning the different modules and keeping them from slipping. In an alternative embodiment, the e-system is removable and the orthotic can be a footbed with replaceable orthotic/insole or a single unit orthotic with the sensor system secured between a cover and the orthotic surface.

The e-system according to embodiments of the present invention can comprise a micro controller unit (MCU), an inertial measurement unit (IMU), memory (e.g., flash memory), a radar subsystem (e.g., UWB chipset operable at any frequency (e.g., 30 GHz, 60 GHz, 140 GHz, etc.), a communication subsystem (e.g., Bluetooth (BLE) chipset, cellular or multi-mode transceiver), a power management subsystem, a battery, an energy harvesting subsystem, and an antenna array. In various embodiments, the antenna array can consist of a grid of fractal antennas creating a synthetic aperture radar (SAR) and uses multiple in multiple out (MIMO) and beam forming. The array collects a wide range of biomechanical and biometric data.

In various embodiments, the antenna array is self-healing so a user can cut through the array without damaging the system or degrading data quality. The IMU can contain an accelerometer, gyroscope and magnetometer, and the radar sensor system can include a signal generator, transceiver, and antenna array consisting of one or more antennas. The radar sensor system can further comprise one or more transmitter/receiver modules (TRMs) using one or more antennas with one or more elements arranged in one of a plurality of array types. The system may further contain an induction power receiver that interfaces with the power management system and an induction charging system. In various embodiments, the antenna array and sensors may be integrated into the HID. In specific orthotic insole embodiments, the antenna array and sensors may be integrated into the footbed, mounted between the footbed and orthotic/insole, or located in or on the insole/orthotic. The various other electronic elements can be located in or on the footbed, including some or all the sensors, for example.

In various embodiments, a registration system is employed to keep the components aligned, including registration posts in one body (e.g., the footbed in the orthotic insole example) and mating registration openings, indentations or holes in another body (e.g., the orthotic insole in this example) such that, when mated, the posts engage the openings to retain the two bodies together. The registration system according to embodiments of the present invention prevents relative movement between the footbed and the insert/orthotic and any layers there between or around. In various embodiments, a hook-and-loop type registration system can be employed. The registration system further supports implementable sensor arrays by providing a method for connecting these arrays to the related electronics. The registration system can also facilitate the connection of any other electronics housed in or on the device (e.g., to connect the orthotic insole to the electronics in the footbed).

In various embodiments, an HID can be produced through additive or subtractive manufacturing techniques, including, but not limited to, techniques such as 3D printing, injection molding, stamping, die casting, computer numerical control (CNC) machining, powder processing, selective laser sintering (SLS) and spark plasma sintering (SPS), for example. Further, the HID can be printed in more than one part, wherein one or more parts may be employed regardless of use with other compatible parts (e.g., regardless of whether the orthotic is used with a footbed, and one or more parts are not used if the user decides to wear the orthotic with the footbed).

In manufacturing a custom orthotic according to embodiments of the present invention, a traditional or semi-custom orthotic is inserted into the shoe and resides atop the footbed. Once suitable data is collected as exemplified elsewhere herein, a fully custom orthotic is produced, and the fully custom orthotic replaces the initially inserted orthotic and is fully compatible with the existing footbed. The custom orthotic serves as an interface between the footbed and the user's foot, and is designed, in part, to work with the information and expert system of embodiments of the present invention to improve and optimize user performance, accelerate rehabilitation, prevent repetitive stress injuries, alleviate symptoms of other problems, and/or facilitate accomplishment of some other relevant end goal, as described elsewhere herein. The insert (footbed plus insole/orthotic) collects user biometric and biomechanical data when worn in a user's shoes. The e-system and sensors can be environmentally hardened during the manufacturing process, in various embodiments, such as by encapsulating the e-system in the HID (e.g., footbed) during the manufacturing process.

According to various embodiments, a cover may be provided on the insole/orthotic to protect the footwear, protect any electronics housed in or on the insole/orthotic and to provide a desirable surface for a user who is wearing either socks or no other clothing between the user's bare foot and the insert. In various embodiments, the cover may be a 3D printed material that is printed during the manufacturing process or applied as part of the assembly process according to aspects of the present invention. The cover can also function as an energy harvesting subsystem which is capable of interfacing with the electronics in the footbed to charge the invention in-situ, as described in more detail elsewhere herein. The insert is designed to have heat sink properties, thus enhancing the capabilities of a thermoelectric energy harvesting system and being able to cool or warm a user's foot.

It will be appreciated that the custom insole/orthotic according to embodiments of the present invention can be worn with or without the electronic footbed. In the case where the user does not wish to wear the custom orthotic with the electronic footbed, the orthotic can be interfaced with a physical spacer with approximately the same shape and bulk mechanical properties as the footbed, but without the electronic capabilities.

In accordance with various embodiments of the present invention, the radar sensor system antenna array may include beam forming, beam steering, fractal antennas, phased array, variable array, and/or multiple in multiple out (MIMO), for example. The radar system assists in communicating biometric and biomechanics data obtained from the insert to a smart device, computer, gateway and/or local or cloud-based server, for example. The radar system further can assist, along with communication subsystem, in providing communication between a pair of devices, such as a pair of orthotic inserts positioned within a related pair of shoes, for example.

The radar subsystem can operate in either a passive or active mode where, in the passive mode, it utilizes compatible radio frequencies generated by other sources to collect biometric and biomechanical data (for example, wireless networks, microwave transmissions, television transmissions, etc.). The associated software according to the present invention assesses the quality of the passively collected data and determines if it needs to shift to an active mode.

In various embodiments, the invention can be charged using an induction plate, and data stored, sent and received by the invention can be encrypted and compressed. The induction charging plate can be of sufficient size to hold and charge two shoes each containing the inserts according to the orthotic insole exemplary embodiment of the present invention. The charging plate may or may not include a visual display that provides information on the charge state and health of objects being charged. In various embodiments, the induction charging plate can be powered either by an AC/DC converter or from a powered USB computer interface, and is capable of accommodating 110/220 volt 50/60 Hz power sources. Embodiments of the present invention further provide for designing an HID to optimize the performance of the thermal dynamic energy harvesting system.

Further, in various embodiments, the invention can fuse sensor data and convert IMU data into quaternions. According to various embodiments of the present invention, data can be transmitted and synched between multiple devices, such as multiple shoe inserts and third party devices, for example.

In various embodiments, the expert system component receives, stores, and processes data from a given HID, converting it into a range of biomechanical and biometric parameters and insights. The expert system analyzes incoming data while utilizing additional data streams (e.g., internal and external) for comparisons and to make predictions about the user of the HID, where that user can be an individual user, a team or a group. In various embodiments, the expert system outputs data, information, and insights to an individual/team/group and to their chosen health, wellness, fitness (HWF) and Occupational Health and Safety (OHS) professionals, peers, friends, family, fans, and others based on the user's privacy and engagement setting. Invited HWF and OHS professionals can select the functions and parameters they wish to track within the constraints set by the user. These functions and parameters can be referred to as widgets for purposes of the present disclosure. The user's constraints can be changed by the user at any time where notifications are sent to all affected parties. The HWF and OHS professionals can set notification thresholds for one or more widgets and set notification thresholds for a group of widgets. These notifications can be linked to preset, default or custom actions set up by the HWF or OHS professional such as referring the notification to another professional within the user's team, for example. In various embodiments, exchanges between users and HWF professionals are compliant with laws and regulations and can seamlessly interface with third party EMR and population health management systems, eliminating the need to manually process exporting data, information, and/or insights, for example.

Among other things, the expert system is capable of using real time and historical user data, subsets and aggregate user base data and external data to autonomously design human-interfacing devices. Upon user request, the expert system will manufacture the device, handling the transaction, manufacturing, distribution, and any other aspects related to process and optimizes cycle time, environmental footprint, and cost. The manufactured device is capable of interfacing with the original data-gathering system allowing for confirmation of device and user and as a stand-alone device.

In various embodiments of the present invention, the expert system can conduct data analytics, draw conclusions, provide insight and recommendations, provide a virtual coach, manage a widget store, manage application programming interfaces (APIs), assist with the design and manufacturing of inserts and other human-interfacing devices, and incorporate change management components. With regard to data analytics, the system can take in data generated by a user's wearable device or other HID as well as data from other internal or external data streams and perform various analytic processes, generate predictions and insights and output meaningful, actionable metrics and reports via various widgets. The expert system coordinates and manipulates incoming data to produce an output that is readable by the system's analytical operations and widgets. The data can be synced in a number of ways depending on user preferences. This can include, but is not limited to, syncing each time a user uses the HID, when a user connects to the cloud or a network housing the expert system, every time the user interface is accessed, or whenever the user specifically requests syncing. The expert system can synchronize both raw and calculated data to smart devices, computers, and other devices in various ways. In various embodiments, the expert system can learn from user interactions and offer setting modifications that optimize user preferences or even automatically adjust settings according to the user's needs and desires, for example. Analytical operations and/or packages associated with the present invention clean incoming raw data by, for example, removing corrupted data and outlier values beyond set thresholds. For example, once new data is cleaned, it is appended to any preexisting data that is relevant to the incoming data stream. An analytical hierarchical function can be performed on the dataset based on the widgets that the user/team/group or HWF and OH&S professional have access to. Recalculations can be performed on old data which must be updated to reflect new information. In addition, the expert system can take inputs from the user interface, such as subsetting for a time period, and either send raw data to be calculated and presented locally on a user's smart device or calculated on or within the expert system and sent for presentation post-calculation on a user's smart-device or other compatible device. The expert system according to embodiments of the present invention can store both raw and calculated data locally, on a server or using a distributed storage paradigm. Data can be accessed by a user or machine through the user interface or relevant APIs. The expert system can output data, insights, suggestions and general content in a variety of sensory formats. These may include, but are not limited to, visual outputs, auditory outputs, and haptic feedback outputs. The system may also support direct stimulation of the nervous system as an output and or receive direction from the nervous system. The expert system can export both raw and calculated datatypes in human and machine readable formats upon request through the user interface or associated APIs.

The virtual coach component of the expert system assists in facilitating behavioral change, motivation and achievement of user, HWF and/or OH&S defined goals. In various embodiments, the virtual coach component is able to use natural language processing for both input and output and provide cognitive responses. The virtual coach is able to measure and analyze performance data and provide predictions, insight, and suggestions. The system can measure program effectiveness, recognize overtraining and calculate an actual versus predicted trajectory to assist the user in optimizing performance. Further, the virtual coach is capable of creating training plans which may include identifying exercises and exercise modification. The virtual coach is able to provide real-time changes and updates to the training regimen based on newly acquired data and insights coming from the user, HWF and OH&S professionals or other sources. Further, the virtual coach assists with injury prevention, repetitive stress injury prediction, and performance optimization during competitive and non-competitive events.

In various embodiments, the expert system is capable of optimizing team make-up based on specific goals and objectives. The virtual coach is capable of emulating and enhancing the HWF diagnosis and treatment process. This may include recovery and rehabilitation related virtual coaching. The expert system is further capable of identifying functionally fitting HIDs, and tracking and evaluating performance of HIDs and related HID systems. In various embodiments, the expert system can identify an ideal form from a library of forms, and can optimize a form based on comparative analysis of a selected form.

In various embodiments, the virtual coach component can learn from a user's interactions with the system and the user community what the user may prefer, what stimuli motivates the user, and user progress, assesses the present state against the desired state, runs a sensitivity analysis and scenarios, and dynamically changes aspects of the plan to meet the goal(s) and/or objective(s), or suggests that the user modify goal(s) and/or objective(s). The virtual coach component assesses the impact of the present state and any changes to the roadmap associated with a particular goal and/or objective against any other goals and/or objectives to obtain the most benefit from a user's actions. Further, the virtual coach component can apply its learning capabilities and access to big data to improve its knowledge of the user in an effort to improve the accuracy of its recommendations and decisions. The virtual coach component also has the capability to detect and track stress which can be used for, but not limited to, identify increasing stress levels and notify an individual such as a person with autism to begin their calming exercises, for example. The virtual coach component also has the ability to identify a stress signature and, using user and other available data, improve its predictive capabilities and recommendations. The virtual coach component can also provide the user with information, including but not limited to, events, activities, others in the community, and/or publicly available information that enables the user to meet goal(s) and/or objective(s).

The widget store according to embodiments of the present invention comprises a repository of in-house and third party designed applications that can be purchased by, subscribed to and given to users for utilization with their dashboards. In embodiments, users can have a personal account that remembers their preferences and purchasing information should they wish to recall such information. Users can also access and utilize the widget store anonymously. In various embodiments, the widget management system can automatically optimize widgets and/or dashboards for users, including altering color schemes, changing text sizes, changing language preferences, addressing individual and user base usage, goals, objectives and other parameters, for example.

In various embodiments, the expert system according to embodiments of the present invention has application programming interfaces (APIs) which have various functionalities, levels of access, and pay structures. Among other things, the expert system APIs provide a portal for developers to interface with the expert system. The APIs also provide various levels of read and write functionality with associated security and encryption levels.

With regard to design and manufacturing of HIDs according to embodiments of the present invention, a subsystem of the expert system can be provided that controls all aspects of the manufacturing and distribution process for making HIDs designed by data acquired from the invention. In various embodiments, the expert system is able to take user data, potentially combined with historical data or data from various other populations and other external sources and autonomously design an HID that is custom-tailored to an individual's needs based on the user's anatomy, physiology, activities, form, performance, environment, equipment, apparel, environment, and/or goals. The process for taking data from a user performing dynamic activities and actions and designing any product (e.g., shoes) with a human interface can be extended from the same process used to make a custom HID as described elsewhere herein. The physical manufacturing process can be classified as either an additive or subtractive process or a hybrid of both processes, for example. In various embodiments, the expert system is capable of taking data from analytics and designing a human-interfacing product which is made available for purchase by a user or HWF or OH&S professional. The expert system can provide users and HWF and OH&S professionals with a report detailing how and why the HID is potentially beneficial and what potential risks and/or side effects may be seen. The designed HIDs can be iteratively customized with input from users and HWF and OH&S professionals, for example. In various embodiments, the expert system controls the manufacturing process that is either a centralized, semi-decentralized, or decentralized process where the device (e.g., a footbed) with electronic capabilities can be built using either process or combination of processes.

In various embodiments, HIDs can be produced in a centralized or decentralized location. The production can be controlled by the expert system. For production in a decentralized location, the expert system can send all pertinent printable files, instructions and materials to the nearest available or otherwise most appropriate location of manufacture to the user. For example, it will be appreciated that semi-custom insoles can be designed using the expert system according to aspects of the present invention, using a standard orthotic and/or using interaction between the expert system and a HWF professional.

In various embodiments, the expert system according to embodiments of the present invention can include software which handles change management aspects for the user. Change management is the system for aiding users in achieving set goals, providing incentives and support for achieving them as well as realistic action items tailored to an individual based on their personal profile, activities and the system's assessment, for example. The expert system is able to gather user, HWF, and group defined goals and build a personalized program to aid users in achieving those goals. The system is able to predict cause and effect on a case-by-case basis and produce personalized suggestions. Predictions are based on simulations and trends from the individual user as well as other relevant populations, and external sources.

In embodiments, the expert system provides personalized, desirable incentives to a user to aid them in achieving their set goals, optimizing their training, and performance such as adhering to their plan and exceeding goals and objectives. These could, but are not limited to, access to additional widgets, discounts, third party goods and services, events, and awards such as achievement badges for use with the social integration features. Among other things, the change management system outputs suggestions, insights, and challenges to a user to motivate them based on, but not limited to, an assessment of their historical performance and external information such as user calendar data. The change management component can interface with the virtual coach system, and is able to utilize social pressures through social integration features to motivate change. Additionally, game mechanics can be employed to further motivate users. Suggestions by the change management system can employ immersive gaming techniques, connecting game mechanics to real-world events and contests (e.g., social, competitive and/or promotional) into which there can be external integration with the expert system. As a motivator, the performance data of an individual can be used to influence a character in a game, virtual world, or fantasy sport, for example. Furthermore, communication with Internet of Things (IoT) capable products can be used to influence the individual, such as nutrition, lighting, music, room acoustics, and/or climate, for example. Linked to vehicles, the system of embodiments of the present invention can incentive driving habits. The system's ability to conduct population analysis enables it to recommend connections to a user with other users with similar goals, objectives, profiles to promote support groups, for example. Once users form a support group, they can opt-in to let the virtual coach manage the group for them, recommending activities, activity frequency, and alert team members when an individual is at risk of not achieving a goal or objective, for example. The change management system can be customized by a user or FIWF professional in the case of accelerating results within a medical, sports, or enterprise environment where the latter can be focused on occupational health and safety, wellness, or processes improvement, for example. Further, the change management system can provide relatable, clear and actionable metrics and instructions that can be easily interpreted by a user through the dashboard, biofeedback, and other interactions.

In various embodiments, the system's front-end can consist of network-facilitated and mobile applications that provide the user with insights, data, and biofeedback through a collection of data widgets which can be used independently or in combination. Data can be visualized through a dashboard user interface that can be personalized by the user.

In various embodiments, the functionality of the user interface comes from widgets. As referenced elsewhere herein, widgets are small applications that present specifically requested datasets to a user in a specified manner. In various embodiments, users can subscribe to multiple widgets that can be chosen individually or bundled together. If a subscription model is employed for commercial operation of aspects of the present invention, users can trade one widget out for another without incurring additional fees. Further, newly chosen widgets are able to retroactively access historical data so that there are no lapses in data continuity when changing from one widget to another.

In various embodiments, a user's dashboard is made up of one or more widgets. These widgets can be moved around (e.g., dragged and dropped) and changed by the user. A user can set up multiple dashboards, which can be themed, labeled and organized as seen fit by the user, for example. Each dashboard can have multiple layers or windows. The user interface can contain menus of administrative features which interface with the widget store, wherein the store is made accessible through the user interface or a web browser, with optional social engagement features, device and subscription purchasing, and user preferences, for example. According to various aspects of the present invention, the preferences that can be controlled include, but are not limited, to device management, sharing and privacy settings, community, account management, profile management (user, activity, device, group), report management and other settings. Additionally, the user interface can be provided with a first-time user workflow which is different from the standard workflow. This first-time workflow takes first-time users through the account setup process, device pairing, diagnostics and calibration, for example.

According to various embodiments, the user interface onboards the user, preparing both the user's online profile and the user's device for use with the expert system. The user interface facilitates data sharing, allowing a user to decide what, when, and how to share data with the individuals and groups in their communities. The widgets that make up the dashboards contained within the user interface are in communication with the expert system. The user can change the look and feel of a widget including how often the widget updates. Further, the user can obtain more detail by clicking on a widget or setting up more layers to a dashboard. Additionally, the user interface allows users to manage device calibration, diagnostics, pairing and to see the status of their devices. The user interface also allows users and their approved HWF and OH&S professionals to set goals/objectives and various profiles for different activities and devices. The user interface further has the ability to recover a user's account and account information.

From a community perspective, the user interface allows users to select who within their networks of HWF professionals, family, friends, colleagues, fans, researchers, and research projects can see what types of data and under what conditions. Additionally, users are able to specify which subsets of each data type are shared. The user interface can further contain processes to allow users to share data with selected groups and individuals on a time basis, project basis, event basis or indefinite basis. It will be appreciated that the share and privacy settings can be changed at any time by the user. Further, the user interface includes functionality which allows users to volunteer their de-identified data for research purposes and research projects. For example, in the case of HWF and OH&S professionals, such professionals can access data volunteered by the user base. Further, HWF and OH&S professionals can issue the insert and, as described above, setup widgets and dashboards. Further, HWF and OH&S professionals can set up a dashboard to track multiple users where the expert system can provide insights based on one or more participating users, de-identified data, and external input. In various embodiments, the system provides a clearinghouse (crowdhealing) for researchers and users, allowing researchers, HWF professionals, academics, and enterprises to post their projects, letting users volunteer to share their de-identified data. Alternatively, users can select projects in which they want to participate through a manual search or by recommendations from the expert system. This clearinghouse extends evidence-based care informing diagnostics, treatment, and performance optimization. The projects may or may not include some form of incentive, in various aspects.

In various embodiments, the system of the present invention designs and monitors custom HIDs based on data from the HID and/or a personal device (e.g., a wearable device), improving its accuracy over time and as the user base increases, with or without input from HWF and OH&S professionals. Among other things, the system can assess form to prevent repetitive stress injuries, accelerate rehabilitation, measure exercise and training effectiveness, optimize individual and team performance, predict treatment outcomes and success. The system can accommodate multiple levels of processing with real time processing taking place through the mobile app and its host device, near real time and post event processing in the cloud. It will be appreciated that real time processing can also take place entirely within the insert and/or smart device, with or without the server, according to embodiments of the invention. In various embodiments, the system's back-end provides data storage, management, and processing. Software in the form of groupware can also be provided as a back-end service accessed through the web and mobile apps, and can employ third party collaborative tools such as video conferencing, email, text, and voice to connect users with their communities. The groupware can also enable health-wellness-fitness professionals to let the system provide insight and recommendations or to manually select and track parameters, create notification thresholds, and run analytics based on a user's real world data, historical data, across their patient/client base, within their medical system, and across the entire user base.

In various embodiments, an additive and/or subtractive manufacturing system component associated with the present invention provides e-commerce capability, resource planning, inventory management, supply chain management including notifications to users on order status and reminders, based on system data, to order new HIDs, such as orthotics, for example.

In various embodiments, a custom HID can be designed and manufactured based on user activity without requiring human intervention. The collected data is analyzed by the software which generates a printable 3D model of the custom HID, creates a report for the user, identifies a printer most convenient or suitable to the customer and sends the 3D model and any instructions for printing. The system can notify the user of progress and delivery options. A technician can perform a quality check of the printed HID, perform finish work, and package the HID for delivery.

In various embodiments, the invention can be used to measure the performance of a user's HID and identify and optimize functionally fitting accessories and/or be incorporated into accessories made available for purchase. Aspects of the invention can be used to provide health-wellness-fitness (HWF) and occupational health and safety (OH&S) professionals continuous real world data about their patients/clients, giving them the ability to improve the quality of their engagement, improve accessibility, increase the speed and accuracy of their diagnostics and treatment, and predict treatment outcomes, such as the need for surgery and its near- and long-term outcome(s), for example. Embodiments of the present invention can be used by HWF and OH&S professionals to improve productivity enabling prevention through early detection, behavioral awareness, and responsibility delegation, which can provide alternatives for a user who may otherwise require an office visit. Embodiments of the present invention can also be used to monitor and self-monitor a user's HWF and enable a user to request emergency response, such as an athlete injured during training, an individual feeling unsafe and/or an injured or at risk elderly person, for example. Embodiments of the present invention can be used by athletes and teams to improve the effectiveness of their exercises and training and optimizing performance during competitive events.

Embodiments of the present invention can be used by coaches and trainers to optimize individual and team performance, reduce the risk of injury and accelerate rehabilitation. Embodiments of the present invention can be used by medical professionals and researchers to understand and optimize the efficacy of diagnostics and treatment by using the inventions analytical and groupware capabilities to gain and distribute insights from the real world data. Embodiments of the present invention can be used by individuals to identify functionally fitting HIDs (e.g., shoes) and businesses within the related device (e.g., footwear) supply chain to provide a personalized fitting experience offering off-the-shelf custom HIDs, for example. Embodiments of the present invention can be used by military and law enforcement to reduce specific HID-related issues and optimize individual and team performance. Embodiments of the present invention can be used to predict and counter repetitive stress injuries. Further, embodiments of the present invention can be used to customize off-the-shelf HIDs. Embodiments of the present invention can also be used by individuals with medical issues that manifest symptoms or indicators such as diabetes, arthritis, neuropathy, stroke, and dementia to identify and prevent issues and behaviors that may diminish their quality of life and number or severity of symptoms, for example.

Embodiments of the present invention can be used to provide location services and data to HWF and OH&S professionals. Embodiments of the present invention can be used as a tool to enhance data collection in clinical trials. Embodiments of the present invention can be used to predict the outcome of treatment options such as recovery rate and long-term results of physical therapy and surgery. Embodiments of the present invention can be used by HWF professionals to collect real world user data based on specific or generic activities such as athletic, work, recreational, and daily activities. Embodiments of the present invention can be used in training and fitness facilities to track and improve the efficacy of exercise, optimize form, recommend changes to the regimen, predict repetitive stress injuries, and assess the regimen's ability to meet objectives. Embodiments of the present invention can be used for both indoor and outdoor activities and in clinical and non-clinical environments.

In various embodiments, the present invention provides a digital materialization system, device and method that can describe, create, monitor and manipulate a physical object using data collected by sensors, digital libraries, and digital feedback. Such can be used by an expert system in accordance with aspects of the present invention to design, validate, and fabricate the physical object, where data collected from the use of that physical object updates the digital libraries and can contribute to the modification of the physical object on an ongoing basis as appropriate. The modification process can present itself as a discrete activity initiated by a request or can occur automatically by either generating a new physical object or the physical object modifying itself, according to various aspects of the present invention. An example of the latter can involve an orthotic that adjusts one or more properties to optimize a set of criteria such as a foot orthotic using artificial muscles to modify itself in an effort to optimize free motion, prevent repetitive stress injuries and/or optimize performance. The sensor data can include, but not be limited to, biometric, kinematic, biomechanical, environmental and object data. The digital libraries can include, but not be limited to, materials, models, biomechanical, kinematic, and behavioral libraries, for example. Digital feedback in the form of qualitative and quantitative input can include, but not be limited to, user satisfaction, observations for professionals, measurements from other systems, scraping the internet for content pertinent to the user's interest and activity and, in the case of the HWF professional, enhancing evidence-based care, for example. The dynamic digital materialization according to aspects of the present invention provides a deeper understanding and sophisticated manipulation of matter without the intervention of humans during the design, validation, fabrication, data collection, and library management processes. This results in rigorous digital descriptions of physical objects that, in conjunction with the system's expertise, can adapt an object to a user's personal needs and preferences.

BRIEF DESCRIPTION OF THE DRAWINGS

FIG. 1 is an exemplary architectural diagram illustrating communications and functional elements associated with embodiments of the system of the present invention.

FIGS. 2 and 3 are schematic diagrams illustrating system components according to embodiments of the present invention.

FIGS. 19 through 37 are an exemplary user interfaces associated with embodiments of the present invention.

DETAILED DESCRIPTION OF EMBODIMENTS

Figure 4:
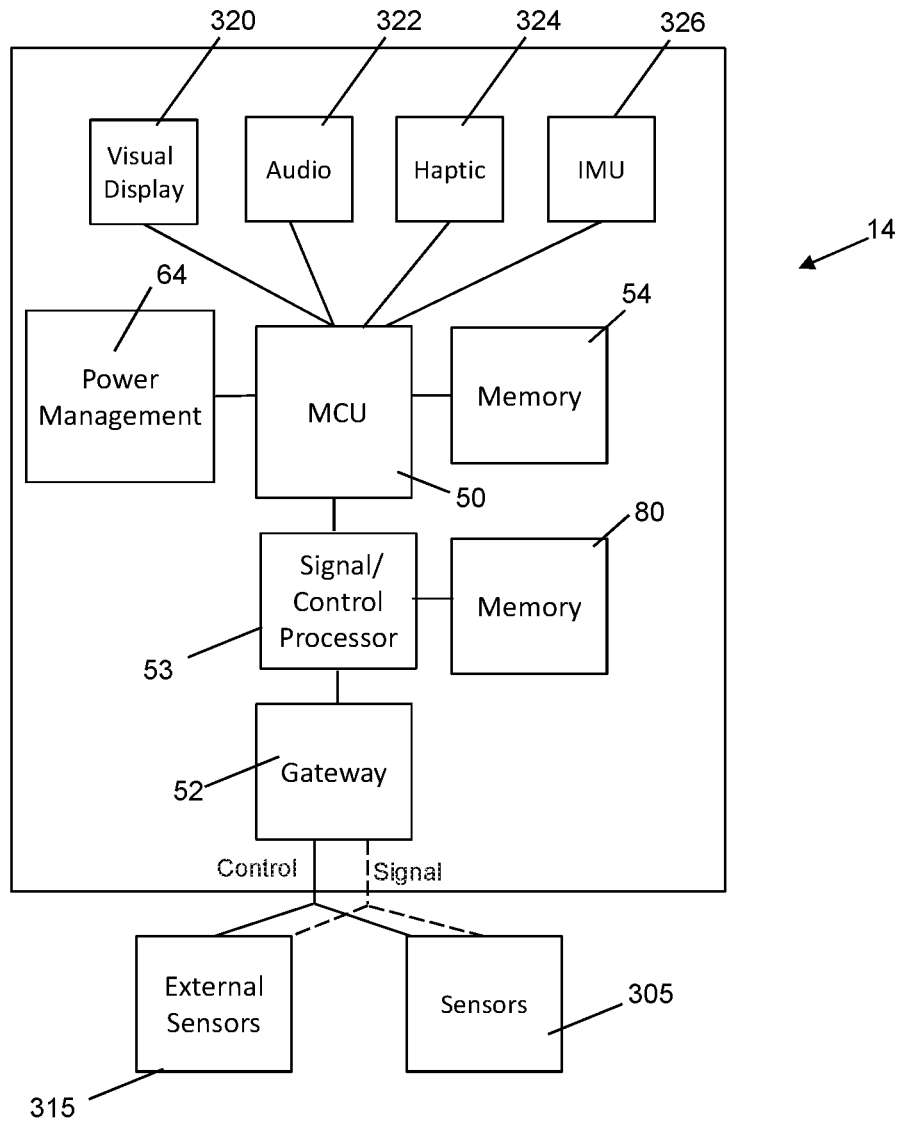
FIG. 4 is a schematic diagram illustrating elements of an e-system component according to embodiments of the present invention.

As depicted in FIGS. 1 through 19, embodiments of the present invention provide a system 40 including a human interfacing device (HID) 10 communicatively coupled to a hub 12 and a remote central server 20. As illustrated in FIG. 1, the central server 20 can comprise at least one processor, memory and programming operable to direct the processor to perform various functions, including administrative component 21 for managing user interactions, including registration, requests and feedback, widget component 22 for offering functional widgets, analytics component 23 for performing analytics, API component 24 for offering various APIs, widget optimizer component 25 for offering customization and optimization functions for various widgets made available through widget component 22, native device and web applications 26, design component 27 for generating HID designs, manufacturing component 28 for instructing the manufacturing of various HID designs, including managing additive and subtractive printers and printer technologies, printer maintenance and supplies, and coordinating printer vendors and suppliers, distribution component 29 for managing the distribution of files, data and end user delivery of completed HID products, and coach component 30 for managing recommendations, training, injury prevention and other aspects on behalf of other users and beneficiaries of HIDs in accordance with the overall embodiments of the present invention. Other functional components can be provided as part of server 20 or as external systems 35 accessible to server 20, including transaction processing, e-commerce, publications, product offers, customer engagement and other functions associated with embodiments of the present invention. The server 20 holds and/or can access all of the libraries (represented generally at 33 in FIG. 1) associated with the present invention, including those identified in the digital materialization (DM) and/or dynamic digital materialization (DDM) processes described elsewhere herein.

At least one e-system 14, as shown in FIGS. 2 through 4, can be embedded within an HID, or maintained as physically separated from, but communicatively coupled to the HID 10, remote server 20, smart device 92 and/or other computing device 90, wherein the e-system 14 comprises at least one micro controller unit (MCU) 50, a radar sensor subsystem (e.g., Transmitter Receiver Module (TRM) or gateway 52), a memory 54, and a power management system 64 which incorporates a battery for providing power to the e-system and additional include an energy harvesting subsystem. The e-system 14 may be co-located with one or more sensors 305a-n interfacing with the e-system 14 through a wired or wireless connection to the gateway 52. The sensors 305a-n can be grouped into sensor arrays, such as arrays 310a and 310b, or may be independent sensors as 305n. The sensors can receive control information from the e-system 14, and can provide signal data back to the e-system 14 via gateway 52. A signal/control processor (SCP) 53 manages these communications with MCU 50 and can include independent SCP memory 80. The SCP 53 performs signal and control processing related to the sensors and manages local system and data management, with the ability to conduct some or all analytics locally. As shown in FIG. 4, the sensors can include sensors (indicated generally at 305) secured to an HID, as well as external sensors 315 that may be provided as part of an external item, such as a wearable technological device generating data employable by the present invention for any of the various purposes described herein.

The e-system 14 can operate passively or actively (e.g., defaulting to passive) based on the availability of non-cooperative sources such as television, cellular, wireless, and radar transmissions. The e-system 14 can adaptively adjust signal strength, modulate signals, modify waveforms including, but not limited to, transmitting and receiving multiple modes, modulations, waveforms and frequencies simultaneously or sequentially. As shown in FIG. 3, the sensors are capable of forming one or more sensor arrays 310*a*, 310*b* in conjunction with or without an e-system 14. In the case of the former, a sensor inertial measurement unit (IMU) is not required but can be used in situations where the surface supporting the sensors forming the sensor array is not stable or consistent. In the latter, a single sensor can be assigned as master with respect to both the IMU and TRM or one or the other with the other sensors operating as slaves within the chosen mode. The master status can also apply to communicating with an e-system 14 where the master sensor acts as an intermediate hub or gateway, for example. Among other things, the sensor array can provide sufficient data to the e-system 14 to identify its position in relation to the e-system 14 and other sensors. In various embodiments, the e-system 14 adaptively forms and steers beams directing one or more antennas and or antenna arrays to optimize transmission and reception as well as assigning independent tasks to one or more antennas such as targeting features of interest, communicating with the e-system 14, forming a mesh network, and sweeping areas of interest, for example. The e-system 14 is capable of using one or more antenna arrays as a real or synthetic aperture, and is further capable of implementing Multiple In, Multiple Out (MIMO) and distributed MIMO using multiple sensors. An antenna array 60 (shown in FIGS. 13 and 15-17) can comprise one or more fractal antennas capable of ultra wideband and sub-band transmission and reception, where ultra wideband is defined as emitted signal bandwidth exceeds the lesser of 500 MHz or 20% of fractional bandwidth.

In addition, the e-system 14 can adaptively control and coordinate sensors, optimizing characteristics such as, but not limited to, power and resolution using such capabilities selecting from a variety of modes and modulations and, in the case of passive coherent location (PCL) mode, selecting a reference sensor. The e-system 14 can adaptively determine levels of sensor autonomy, and can adaptively process sensor data to optimize such characteristics as, but not limited to, image resolution. As shown in FIG. 2, the e-system 14 can communicate with remote devices (e.g., 20, 90, 92) wirelessly, such as through a gateway or hub (e.g., hub 12 in FIG. 1), for purposes such as, but not limited to, permanent data storage, dashboard administration and maintenance, analytics, and community interaction such as linking with HWF professionals as described elsewhere herein. Various outputs can include visual 320, auditory 322, kinesthetic/haptic 324 and inertial 326 for the purpose of status, diagnostics, biofeedback, and system interaction. The e-system 14 can map locations of sensors with sufficient accuracy to enable analytics and expert systems to adjust for any sensor misalignments, and further can support the continual refinement of analytical models such as kinematic and biomechanics models in the case of health wellness fitness applications. In alternative embodiments, the e-system 14 can be in a form factor that fits on the wrist, arm, leg, or head. In the latter embodiment, the e-system 14 can be integrated into or attached to eyewear providing a heads-up display through a clear OLED-based screen that is applied to an existing lens or acts as the lens, not a projection system, as well as other interactions such as haptic and audio where audio could include voice commands, for example. In such embodiment, the OLED-based screen could also provide tinting to improve vision in bright setting, for accuracy, and for accurate color rendition, optionally with sunglasses accentuating different sections of the color spectrum based on the various manufacturing processes for sunglass lenses.

Figure 5:
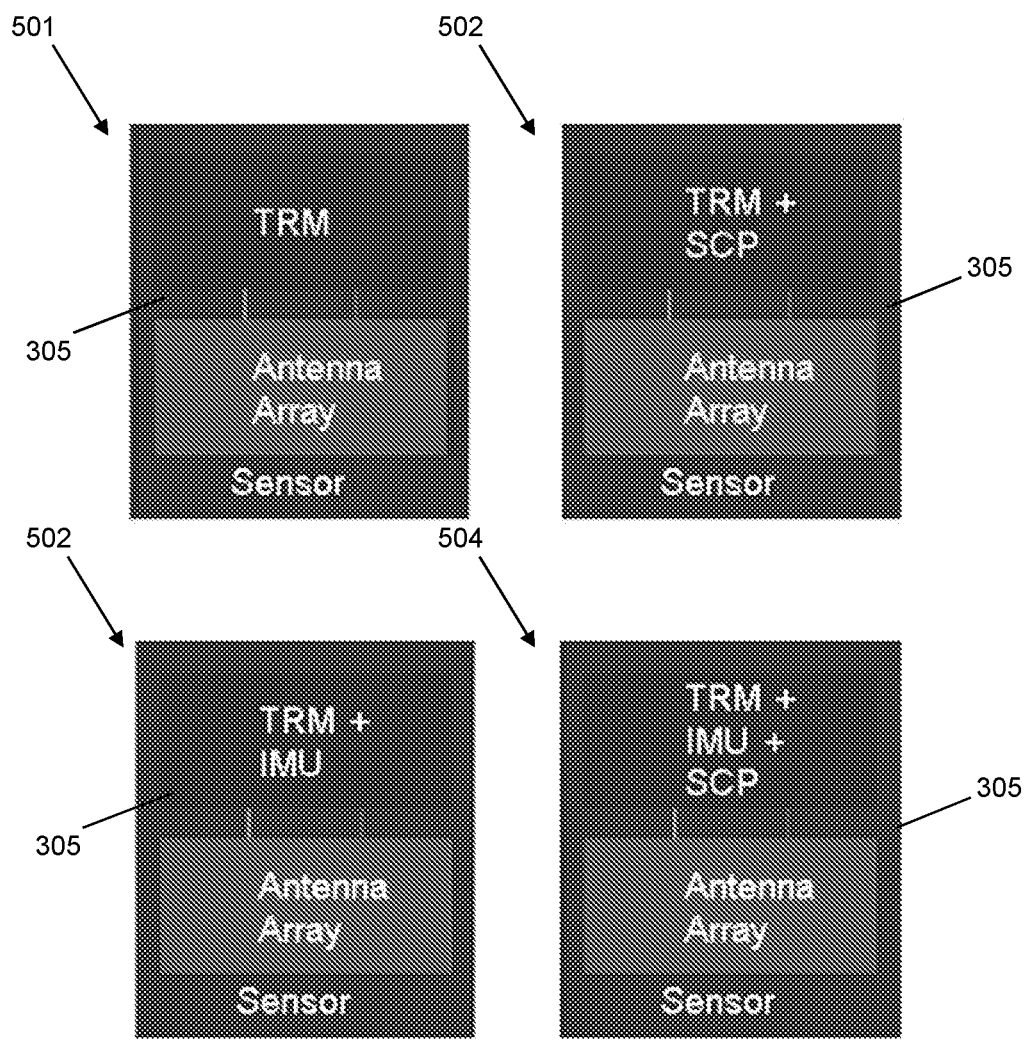
FIG. 5 shows diagrams of representative sensors according to embodiments of the present invention.

As shown in FIG. 5, a basic sensor module 305 is shown at 501 can include one or more Transmit Receive Modules (TRM) and one or more antennas which can comprise one or more antenna arrays. In various embodiments, the sensor module and or the sensor array can operate as one or more monostatic, psuedo-monostatic, bistatic, or multistatic systems. IMU supports sensor mapping and physical changes in the sensor's orientation and position with respect to the target, such as, for example, changes to the sensor's position on an article of clothing, in a shoe, direct contact with the body. The module 305 shown at 501 can be employed in a sensor architecture for use in a sensor array where sensors are co-located and hardwired to an e-system, for example. The sensor module 305 shown at 502 can be employed in a sensor architecture for use in a sensor array where sensors are co-located, with a hardwired or wireless connection to an e-system, and require local signal and control processing via the SCP component of the module 305 shown at 502. In various embodiments, this arrangement can be deployed as an integrated chipset, for example. The sensor module 305 shown at 503 can be employed in a sensor architecture for use in a sensor array where sensors are distributed and connected wirelessly to an e-system, for example, where the sensor 305 includes a TRM, an IMU and an antenna array. The sensor module 305 shown at 504 can be employed in a sensor architecture for use in a sensor array where sensors are distributed, connected wirelessly to an e-system, and require local signal and control processing, where the sensor 305 includes a TRM, IMU and SCP as shown.

With reference to FIGS. 1 and 6-8, the present invention provides, among other things, a system 40 that operates to inform a wide variety of components for various purposes. For example, database 33 (represented generally in FIG. 1) can store various libraries such as a parameter library 331, process library 332, kinematic model library 333, user characteristics library 334 and historical user data library 335. Table 1 below provides details of various types of parameters that can be included in parameter library 331 and tracked according to embodiments of the present invention.

TABLE 1

| Force | Shear | AHRS | Biometric |
|---|---|---|---|
| Pressure | Shear | Orientation (planar position) | Navicular drop |
| Amount | Amount | Position | Muscle activation |
| Location | Location | Dead reckoning | Joint and bone movement |

TABLE 1-continued

| Force | Shear | AHRS | Biometric |
|---|---|---|---|
| Line | Direction | Elevation | Blood pressure |
| Center | Gradient | Pace/Distance Traveled | Blood flow |
| Peak pressure | Duration | Gait speed | Oxygenation (O2) |
| Location | Pinch Shear | Phase speed | O2 Saturation |
| Duration | Amount | Acceleration | Pulse |
| Peak pressure gradient | Location | Base Width | Caloric burn |
| Transverse | Gradient | Center of Balance | Hydration |
| Anteroposterior to frontal | Duration | Preferred Line of Balance | Foot shape and dimensions |
| Zone-to-Zone | Peak Shear Stress | Frontal | Performance |
| Pressure time integral | Amount | Sagittal | Form |
| Power/Torque | Location | Mediolateral | Fatigue |
| Contact phase duration | Gradient | Instability | Risk, repetitive stress injury |
| Swing phase duration | Duration | Amount | Speed |
| Gait length | Depth | Location | Endurance |
| Gait duration | Intra/Inter-foot comparison | Line | Capability/Capacity |
| Steps taken | Composite | Directional changes | Agitation/Emotional stress |
| Intra/Inter-foot comparison | | Great toe flexion | Fall risk |
| Composite | | Intra/Inter-foot comparison | Intra/Inter-foot comparison |
| | | Composite | Composite |

Process library 332 can include, for example, detailed algorithms for evaluating data in the database according to different requested purposes, such as, for example, managing or preventing repetitive stress injuries, generating an orthotic design for manufacturing, managing user performance, optimizing HID fitting, supporting rehabilitation efforts, improving exercise/workout effectiveness, facilitating virtual coaching, predicting bodily falls, assessing location, performing gait analysis, assessing form, assessing stress, performing research, supporting occupational health analysis, and/or providing an information dashboard.

Figure 6:
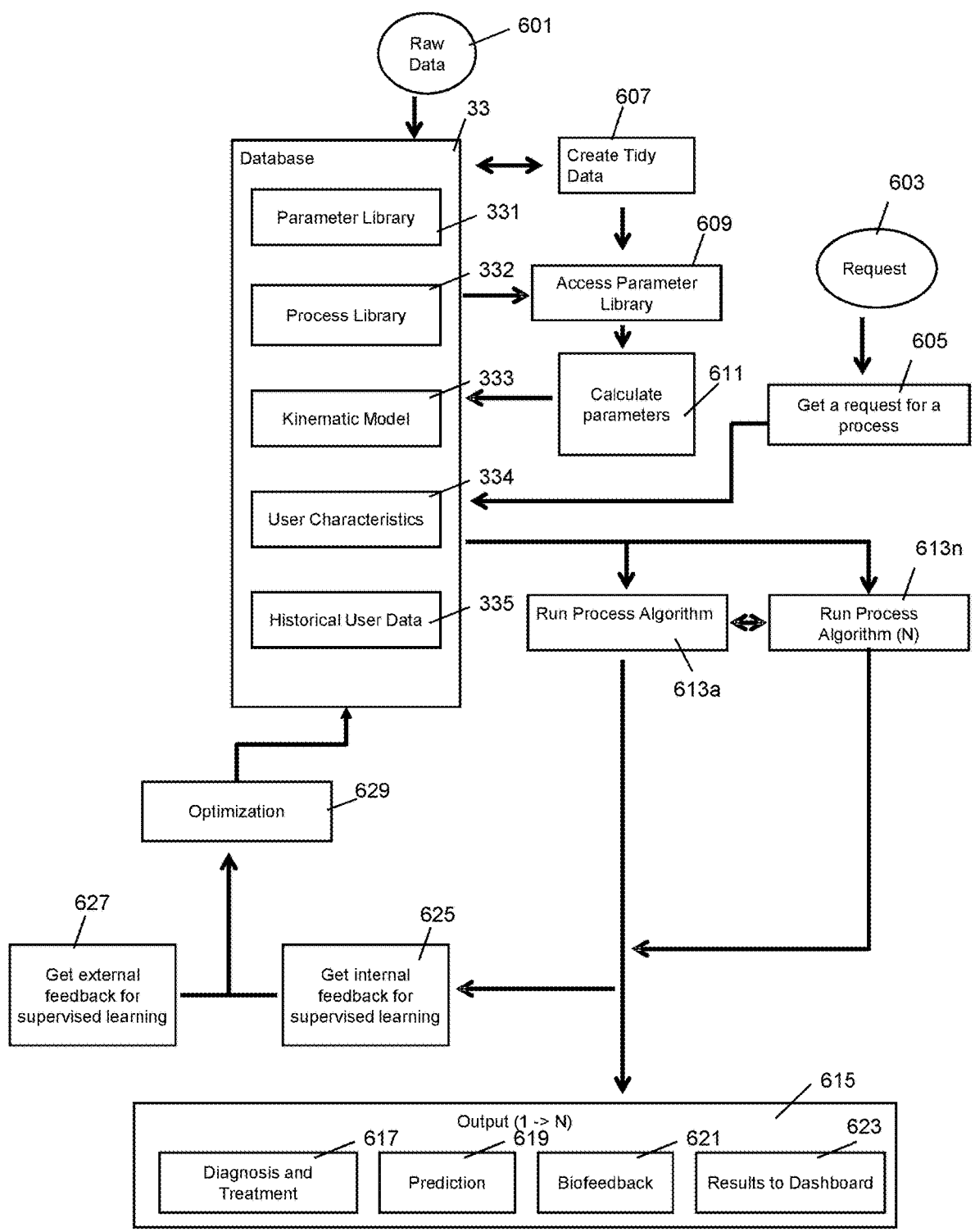
FIG. 6 is a flow diagram illustrating various software processes according to embodiments of the present invention.

FIG. 6 illustrates how parameters and functions are evolved in accordance with embodiments of the present invention. As shown therein, raw data 601 can be entered into the database (through admin component 21 of server 20, for example) representing, for example, past studies, historical user data, baseline parameters, baseline process algorithms and similar items. An external request (such as through admin component 21) can be received, or an internal request can be received, as at 603, instructing the system to initiate a requested process as at 605. A subset of organized data relevant to the request, i.e., "tidy" data, is pulled and/or derived as at 607, the relevant parameter library or libraries are accessed as at 609 and parameter information is calculated as at 611. For an initial request, parameter calculations may be assessed based upon the request. For example, if a request is to run a process to predict repetitive stress injuries for a given operation or use of a given HID such as an orthotic insole, the present invention may operate to employ various force, shear, AHRS and biometric parameters as identified in Table 1 above. Various process algorithms 613a-613n can then be run to address the request and targeted output 615. The output 615 can include, for example, diagnosis and treatment 617, prediction 619, biofeedback 621 and publishing results to a user dashboard 623, for example. Internal 625 and external 627 feedback, such as qualitative data from a user or coach, for example, can be employed to inform the optimization processes 629 according to embodiments of the present invention, and the resulting information from the running processes and inputs can be continually fed to the database 33 to inform future activities and processes, both for the requesting user for the specific output, as well as for future users with overlapping scenarios, requests, outputs, parameters and/or processes, for example. In this way, the collective knowledge and wisdom of the system 40 is continually improved.

Figure 7:
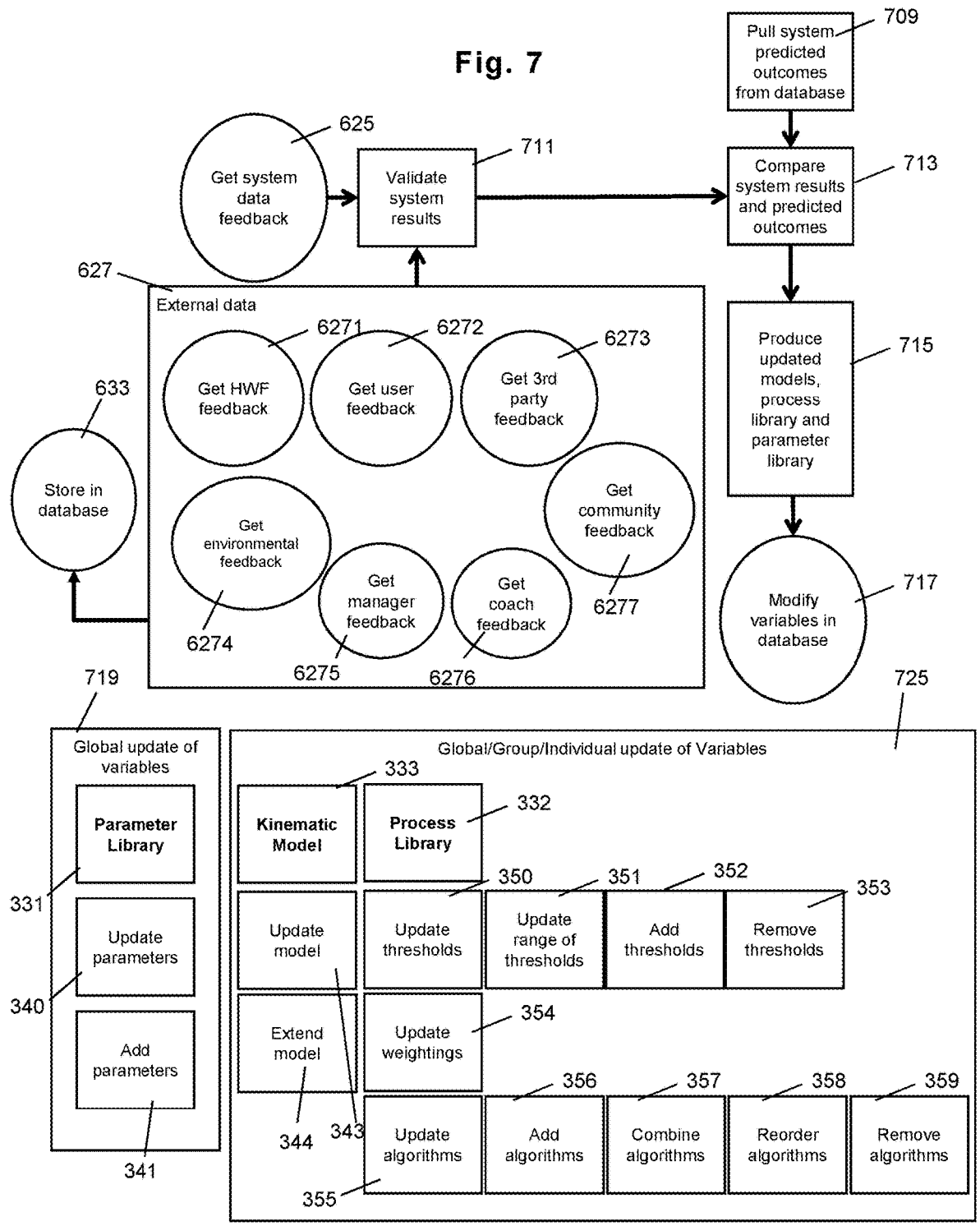
FIG. 7 is a flow diagram illustrating an optimization process according to embodiments of the present invention.

FIG. 7 illustrates process steps involved in the optimization routines 629 of FIG. 6, according to various embodiments of the present invention. As shown therein, external feedback 627 can encompass health, wellness and fitness (HWF) professional feedback 6271, user qualitative feedback 6272, third party feedback 6273, environmental feedback 6274, manager feedback 6275, coach feedback 6276 and community feedback 6277, and such feedback can be stored in the database as indicated at 633. Similarly, system data and/or internal feedback 625 can be collected, and can be combined with external feedback 627 to validate system results as at 711 for requested processes, for example. At 713, such results can be compared with system predicted outcomes pulled from the database as at 709, and updated models, processes and parameters can be produced as at 715 for current and later use. In comparing the system results and predicted outcomes at 713, the appropriate kinematic model 333 from database 33 can be accessed, the system results can be accessed, a comparative algorithm can be run to identify statistically significant differences between system results and predicted outcomes, and the results can be stored.

In producing updated models, an updated process library and/or an updated parameter library as at 715, results can be pulled as at 709, and variables can be replaced in the relevant models to supports system results. For example, kinematic, burn rate, goal trajectory, and finite element variables can be replaced. If, after multiple iterations, the models and algorithms according to the present invention are not able to predict the system results as desired, the variables in the process library algorithms can be replaced in order to more accurately predict the system results. Further, if, after multiple iterations of the process library updates aren't able to predict system results, replace variables in parameter library algorithms to accurately predict the system results.

In terms of system evolution, processes can be employed whereby a large number (e.g., 1000) copies of the models, process library, and parameter library are generated, variables are randomly changed within each model, process and parameter library, the accuracy of the randomized models, process and parameter libraries are evaluated by comparing the system results, original predicted outcomes, and randomized model outcomes, a top percentage (e.g., fifty percent) of the most accurate models are paired, and multiple (e.g., two) "child" model, process and parameter libraries are generated which share randomly selected characteristics from the paired "parent" models. This process of randomly changing variables within each model, process and parameter library to generate a two "child" model, process and parameter libraries which share randomly selected characteristics from the paired "parent" models can be repeated until a more accurate model, process, and parameter library is generated.

System variables can also be updated as a result, as at 717. In the process, the global update of variables 719 for the parameter library 331 can include updating current parameters as at 340 and adding new parameters as at 341. The global, group and/or individual update of variables 725 for the kinematic models 333 can include updating current models as at 343 and adding new and/or extending the models as at 344. The global, group and/or individual update of variables 725 for the process library 332 can include updating thresholds 350, which can include updating a range of thresholds 351, adding new thresholds 352 and/or removing thresholds 353. Such operations can also include updating variable weightings as at 354 and updating algorithms as at 355, which can include adding algorithms 356, combing algorithms 357, re-ordering algorithms 358 and removing algorithms 359, for example.

Figure 8:
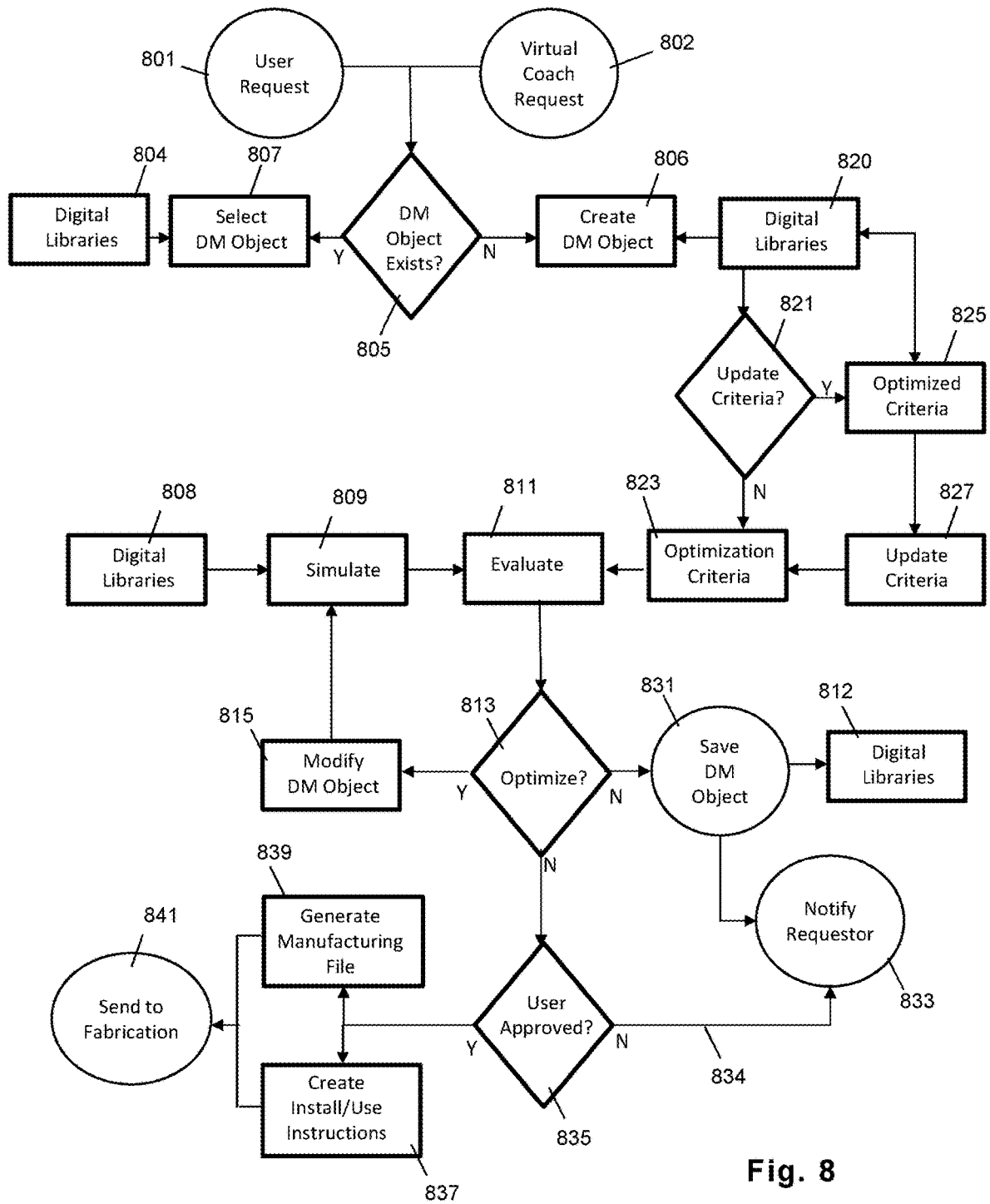
FIG. 8 is a flow diagram illustrating processes according to embodiments of the present invention.

FIG. 8 illustrates a process for digital materialization of an HID in accordance with embodiments of the present invention. As noted elsewhere herein, an HID can be a wearable device, such as a glove, and can also be a non-wearable device, such as handle or grip, or even a device that interoperates between a human part and a non-human part. For example, an HID can be an attachment to a grip or handle that is not worn and that is not the actual grip or handle. As shown in FIG. 8, a user request 801 and/or a third party request 802 is received by the system (e.g., through admin component 21) and the system 40 determines whether the object already generally exists as at 805 in the system database 33. In making the request, the user can identify a purpose associated with the design of the object, including purposes such as injury prediction, performance enhancement, rehabilitation, symptom reduction, product evaluation and/or adapting performance to more closely match another human being (e.g., to play tennis more like a specific professional tennis player).

If the object already generally exists, the system pulls the general object from a relevant library 804 as at step 807, and then simulates as at step 809 and evaluates at step 811 in order to determine whether and what customizations may be necessary to the object in order to optimize the object as at step 813. It will be appreciated that the stored object may be a general object or a specific object (e.g., tennis racket grips in general, or tennis racket grips associated with male human beings above five feet, ten inches in height with mild forms of arthritis. In other words, the system can call up most compatible users in obtaining specific objects that may be most opportune for use with a given user's request.

With reference back to FIG. 8, if it is determined that optimization is beneficial, then analytics 23 and/or coach component 30 can run a detailed simulation. Such component(s) will then evaluate the simulation using the most current optimization criteria, updating the criteria as appropriate. In performing the simulation step 809, the system can pull relevant information from relevant libraries 808, such as, for example, the user's physical statistics, past injuries, and feedback associated with others' uses of the same and similar objects, among other things.

In various embodiments where multiple sensor arrays are in use, such as in an orthotic insole sensor system described elsewhere herein, or a sensor system in the shaft of a racket, for example, the digital materialization process according to the present invention can conduct a multi-body optimization, where the insole and racket are both optimized to, for example, improve the performance of an individual playing tennis by collecting data on the individual's form, results, and equipment and optimizing the design to compensate for deficiencies in the individual's form to improve results.

In the case of shoes, the user can wear an intelligent insert associated with the present invention and, based on the data collected and stored in the various digital libraries, such as, for example, user profile library, preferred and actual form library, kinematic and biomechanical models library, object library (in this case an insole/orthotic), parameters library, analytics library, virtual coach library, materials library, shape library, behavior library, and manufacturing/distribution libraries.

In the case of a handheld device with a shaft, the sensors can be inserted into the base of the device such as a racket, applied to the racket shaft under or over the grip, and worn as a glove, for example. This approach extends to other devices such as saddle where the sensors could be worn under the saddle, on the surface of the saddle, and/or in clothing. Attaching sensors to the equipment may be preferred in various embodiments. However, such approach may not be practical with smaller items such as writing and kitchen utensils. In these cases, the sensors can be worn by the user.

Returning to FIG. 8, if the system determines that the device should be modified for optimization at step 813, then the device is modified as at 815 and the simulation and evaluation steps are again performed until optimization standards are met. If the object can be optimized, then its shape, structure, and or material(s) are changed. Simulations and evaluations are run repeatedly until the object has been optimized, after which it is saved in the digital library, a notification is sent to the requestor (e.g., the user or system 40). As part of the evaluation process step 811, an assessment is made as at step 821 as to whether the underlying criteria require updating from appropriate criteria libraries 820. If not, the criteria are deemed to be optimal for the current process as at step 823. If so, the criteria are optimized as at step 825 and updated as at 827 for use with the evaluation step 811 and further for use in updating the libraries 820. Criteria optimizing at step 825 and libraries 820 further inform the creation of a new HID object as at step 806, should it be determined at step 805 that the requested object does not currently exist in the system database. In various embodiments, the two-step evaluation process can be reduced to a single step, where the initial evaluation is eliminated and the object goes directly to the simulation step.

Referring back to the optimization step 813, if the object requires no further optimization, it is saved as at step 831 and stored in the relevant digital library/libraries 812, and the requestor is then notified that the optimized design for the object has been completed, as at step 833.

The designed object can further be communicated to the user for approval as at step 835. If the object is not approved by the user, the requestor can be notified as at step 833. If the requestor is the user himself or herself, then such user will already know the device has not been approved and the arrow 834 to step 833 need not be involved. If the user approves the design at step 835, then installation and/or usage instructions can be generated as at step 837, and a design/manufacturing file can be produced as at step 839. Such file and/or information can then be transmitted to a fabrication component or system as at step 841 in order to produce the HID as designed.

As an alternative to the operation of FIG. 8, the present invention can incorporate output into the HID itself, wherein the HID is adapted to be able to morph its physical form somehow based upon the optimization process in 813. This dynamic digital materialization process causes the physical object to morph. For example, the morphable HID can be an active shoe insert or shoe that uses artificial muscle to change the contours of the insole and its properties, or can be an active grip morphing to reduce risk of injury and extend and/or enhance performance. In this embodiment, the fabrication and distribution functions are no longer required, as they are replaced by adaptive materials and surfaces.

Figure 9:
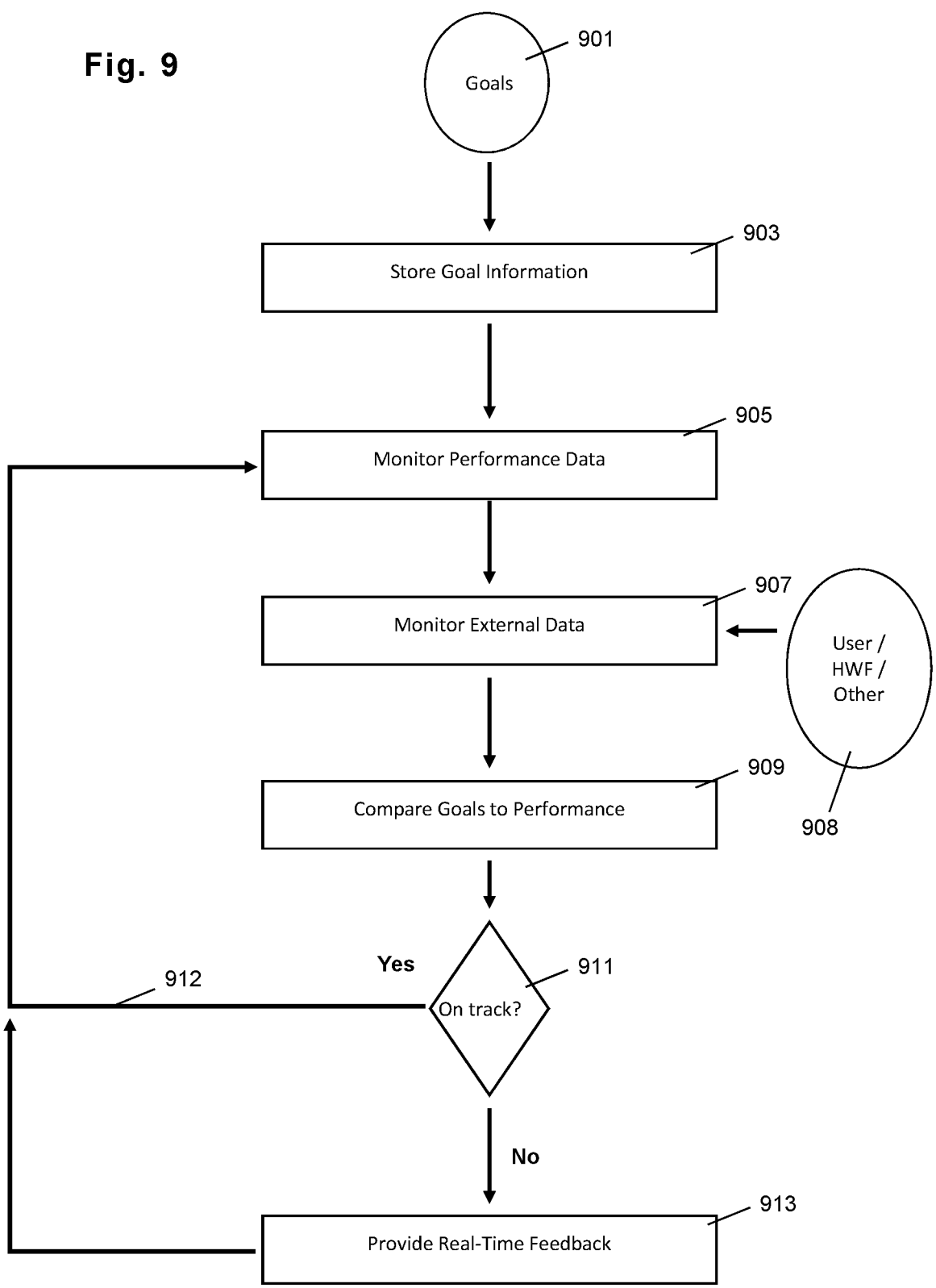
FIG. 9 is a flow diagram illustrating a virtual coach process according to embodiments of the present invention.

FIG. 9 illustrates a sample process flow associated with virtual coach component 30 according to embodiments of the present invention. As shown therein, goals and/or goal information 901 can be stored in the system of the present invention as at 903. The user's performance is monitored at step 905, and external data can be monitored as at step 907, including such data as may be provided by a HWF professional, the user or another as at 908, for example. Goals can then be compared to performance as at step 909, and a determination can be made by analytics component 23 as to whether the user is on track at step 911. If so, the previous monitoring steps are repeated as indicated by arrow 912. If not, real-time feedback can be provided to the user at step 913, such as by communicating with the user's computing device, for example.

Figure 10:
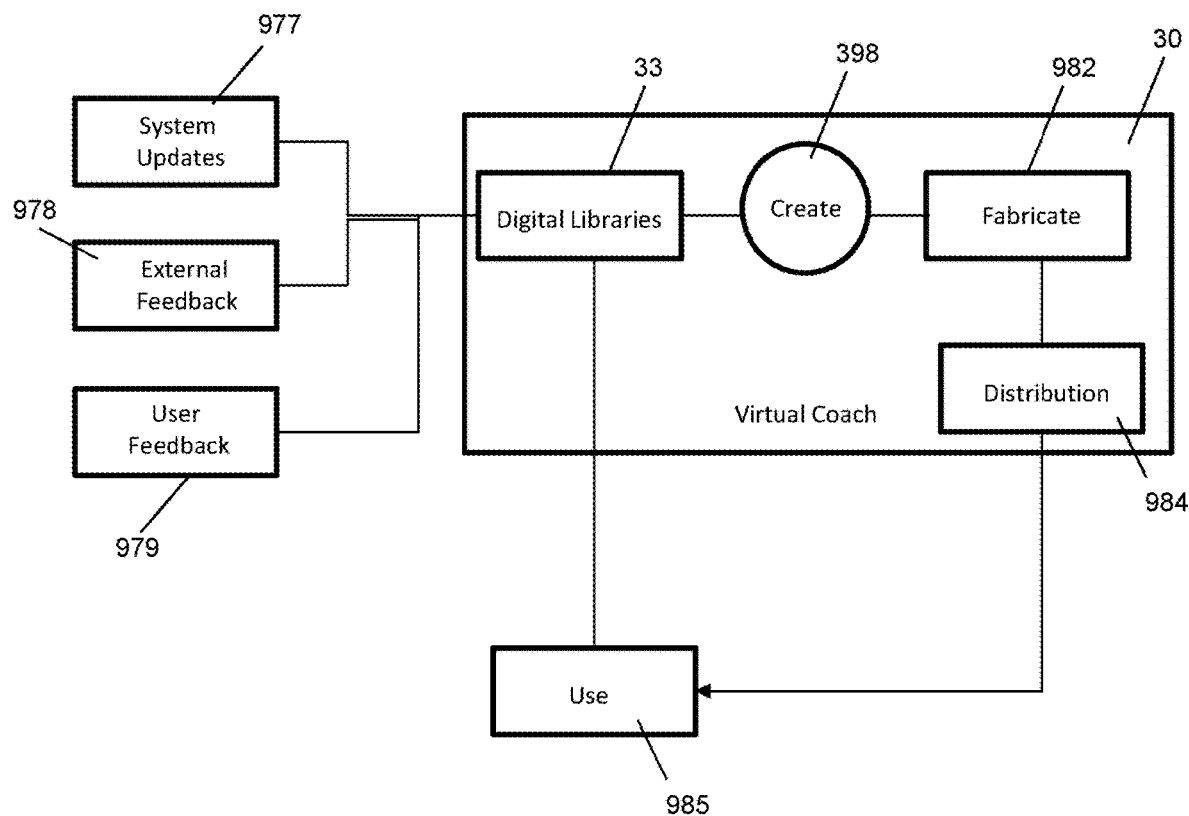
FIG. 10 is a flow diagram illustrating a custom insole construction process according to embodiments of the present invention.

FIG. 10 illustrates further details associated with an expert system such as system 40 of the present invention. As shown therein, the system 40 collects various information and feedback from the system and any HID and related sensors involved, noted at 977, as well as external feedback at 978 and user feedback at 979. The system 40 stores the data in one of several digital libraries 33 including, but not limited to, user data, parameters, analytics, digital materialization objects, activities, user form, various models, range of material characteristics, manufacturing, and distribution data, for example. The digital materialization process can occur based on the libraries to create an HID design file, as at 980. Fabrication at step 982 and distribution at 984 can bring the HID product to the user, whereupon data regarding the use of the fabricated HID by the user can be recorded and stored in libraries 33.

Regardless of the object being fabricated, upon a request by the user or expert system via component 21, for example, the digital materialization (DM) process searches the digital library 33 for an appropriate DM object (e.g., the existing DM object will be the most recently modified DM object). When located, the system 40 loads the DM object along with is associated characteristics from related libraries including, but not limited to, materials, shape, behavior, manufacturing/distribution, models, forms, and user information libraries, for example.

If an appropriate DM object is not available, then the expert system uses the data from all the digital libraries to create a default object combining information gathered from external sources such as the Internet and/or information already stored in a library, as shown and described in connection with FIG. 8. The existing or newly generated DM object and associated data is then assessed by the expert system to determine if it needs to be optimized, as shown and described in connection with FIG. 8.

Figure 11:
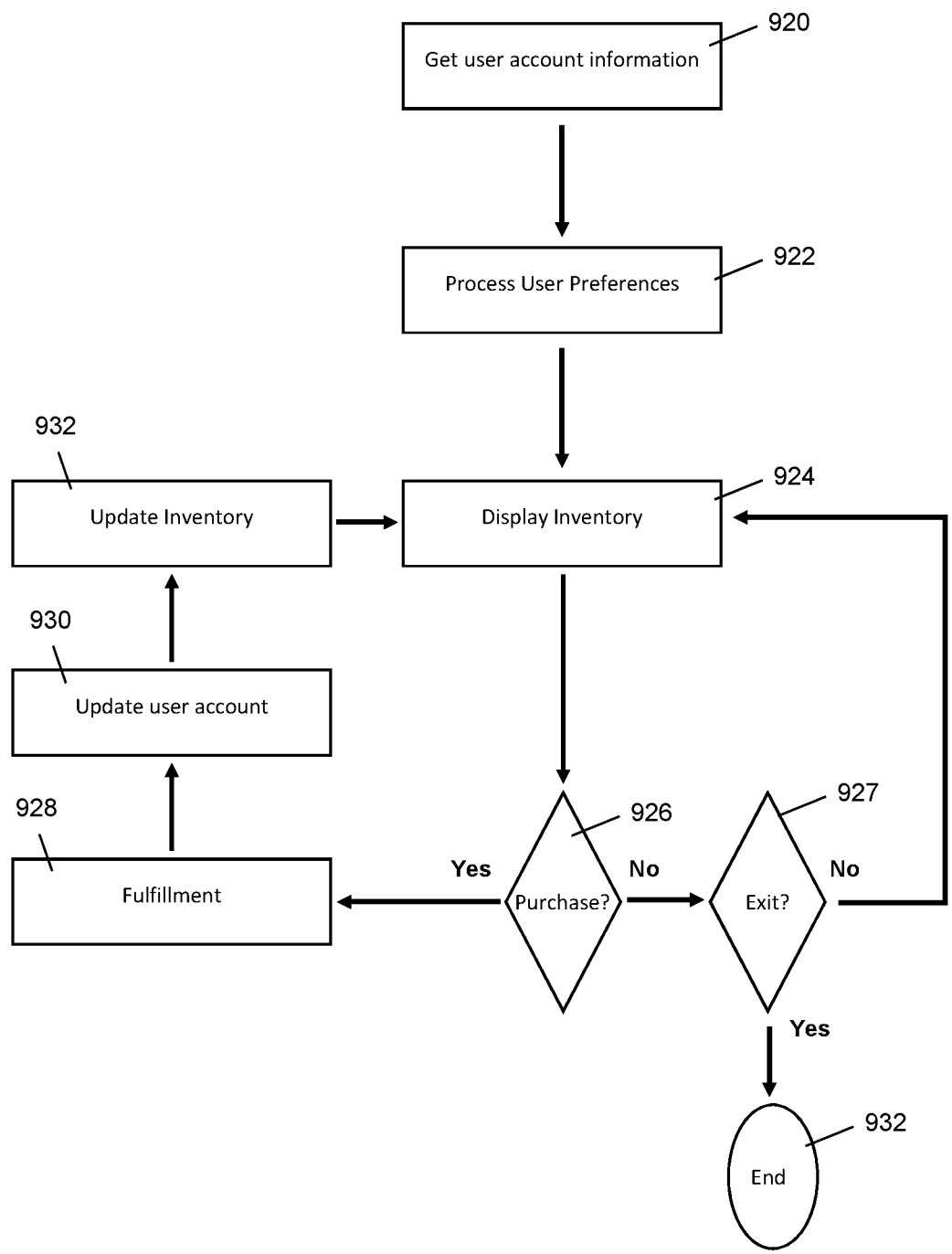
FIG. 11 is a flow diagram illustrating a widget store process according to embodiments of the present invention.

FIG. 11 illustrates a sample process flow associated with widget component 22 according to embodiments of the present invention. As shown therein, user account information is obtained as at 920, and user preferences are processed as at 922. The user's current inventory of subscribed widgets is then shown at 924. If the user desires to purchase additional widgets at step 926, the transaction is fulfilled as at 928, the user account is updated as at 930, and the widget is added to the user's inventory as at 930 so that the user may then manipulate the widget as desired in the user's dashboard or other widget display, for example. If the user does not wish to purchase a widget at 926, then the user is prompted to exit at 927, and given the option to return to the display of current widget inventory at 924. Otherwise, if the user desires to exit, the process completes at step 932.

Figure 12:
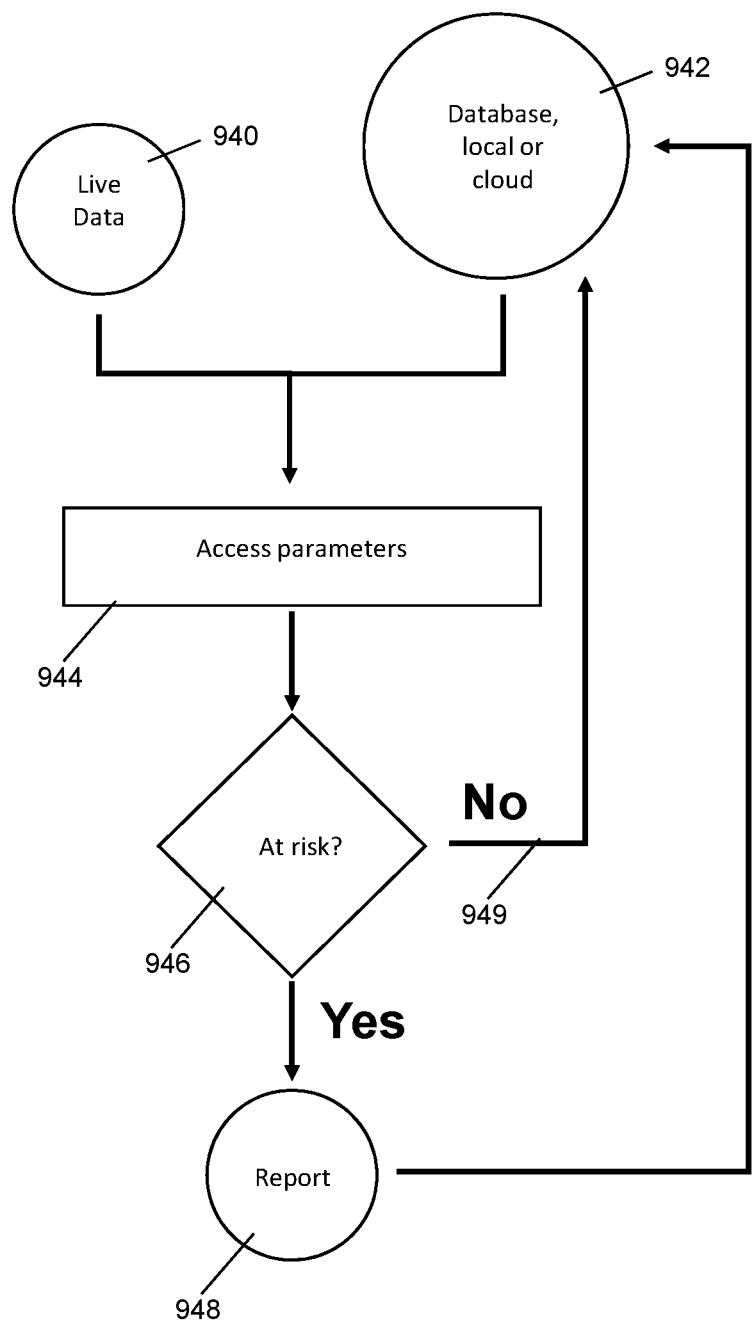
FIG. 12 is a flow diagram illustrating a fall prevention process according to embodiments of the present invention.

FIG. 12 illustrates a sample process flow associated with fall prevention, as may be employed as a safety measure for persons susceptible to falling due to injury, advanced age or other condition. As shown therein, live data 940 and remotely held data, such as cloud-stored data 942 are captured and fall-associated parameters are accessed as at 944. Based on the information and parameters, analytics component 23 determines where the person is at risk at step 946. If so, a suitable report is prepared and transmitted as at step 948. If not, the relevant data is reported to cloud storage as indicated by arrow 949.

It will be appreciated that the process for fabricating products using digital materialization in accordance with the present invention can be consistent, whether the product is a glove, saddle, grip, helmet or orthotic, for example. In various embodiments, the user wears a sensor system, such as an intelligent modular insole described below, or attached to other body parts such as various positions on the legs, arms, torso, and/or head. The sensors can also be mounted inside the shaft a tool, sports equipment, garden equipment, protective gear, etc., where the data collected can be used to design a personalized ergonomic fit and or re-design the item to optimize performance, such as, but not limited to, a tennis racket, golf club, saddles, handlebars, furniture, seating, garden tool, protective gear, kitchen utensils, medical tools, and construction tools/equipment.

Exemplary Case: Orthotic Insole

Figure 15:
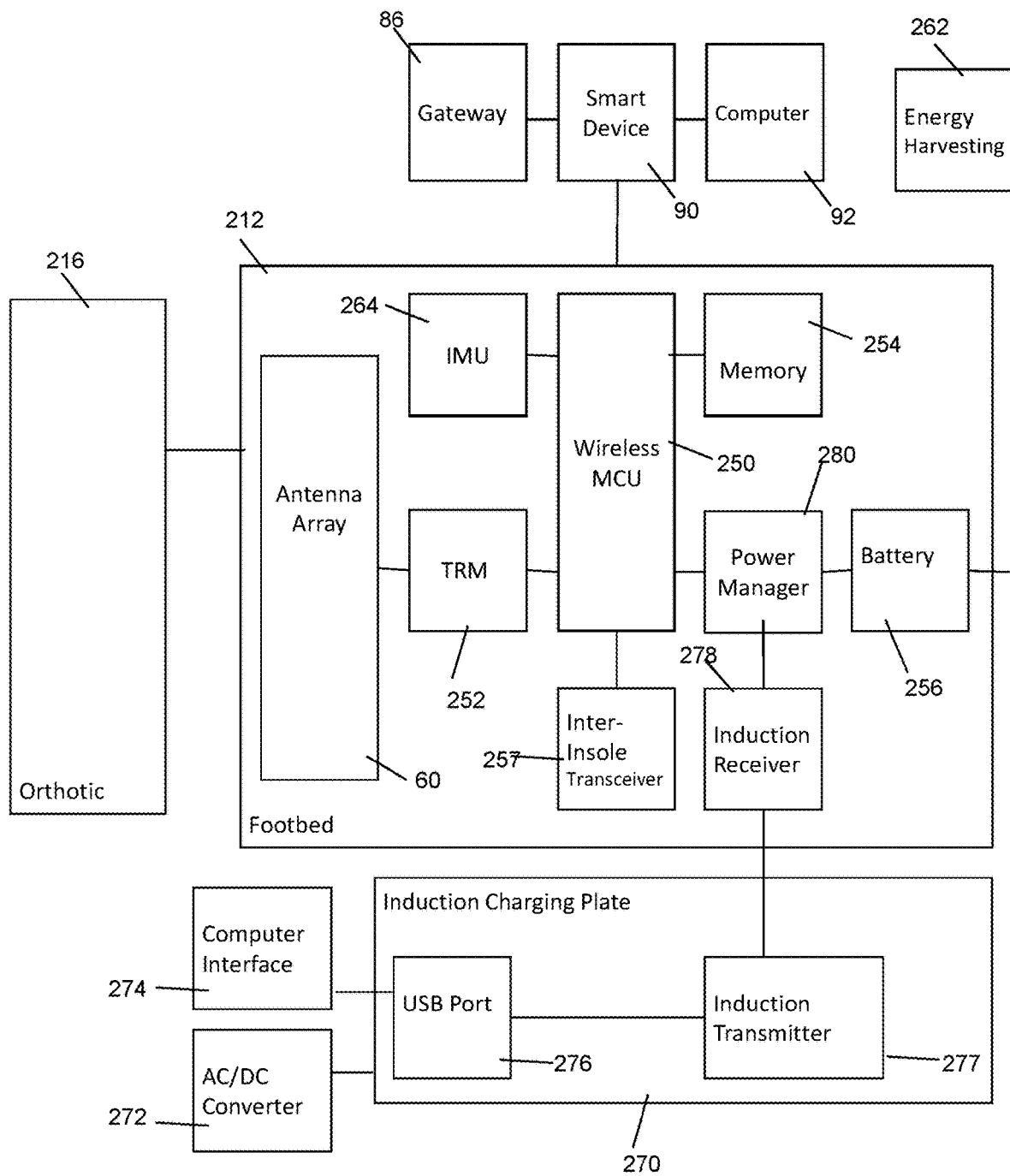
FIGS. 15 through 17 show schematic embodiments of different component combinations of a device according to aspects of the present invention.
Figure 16:
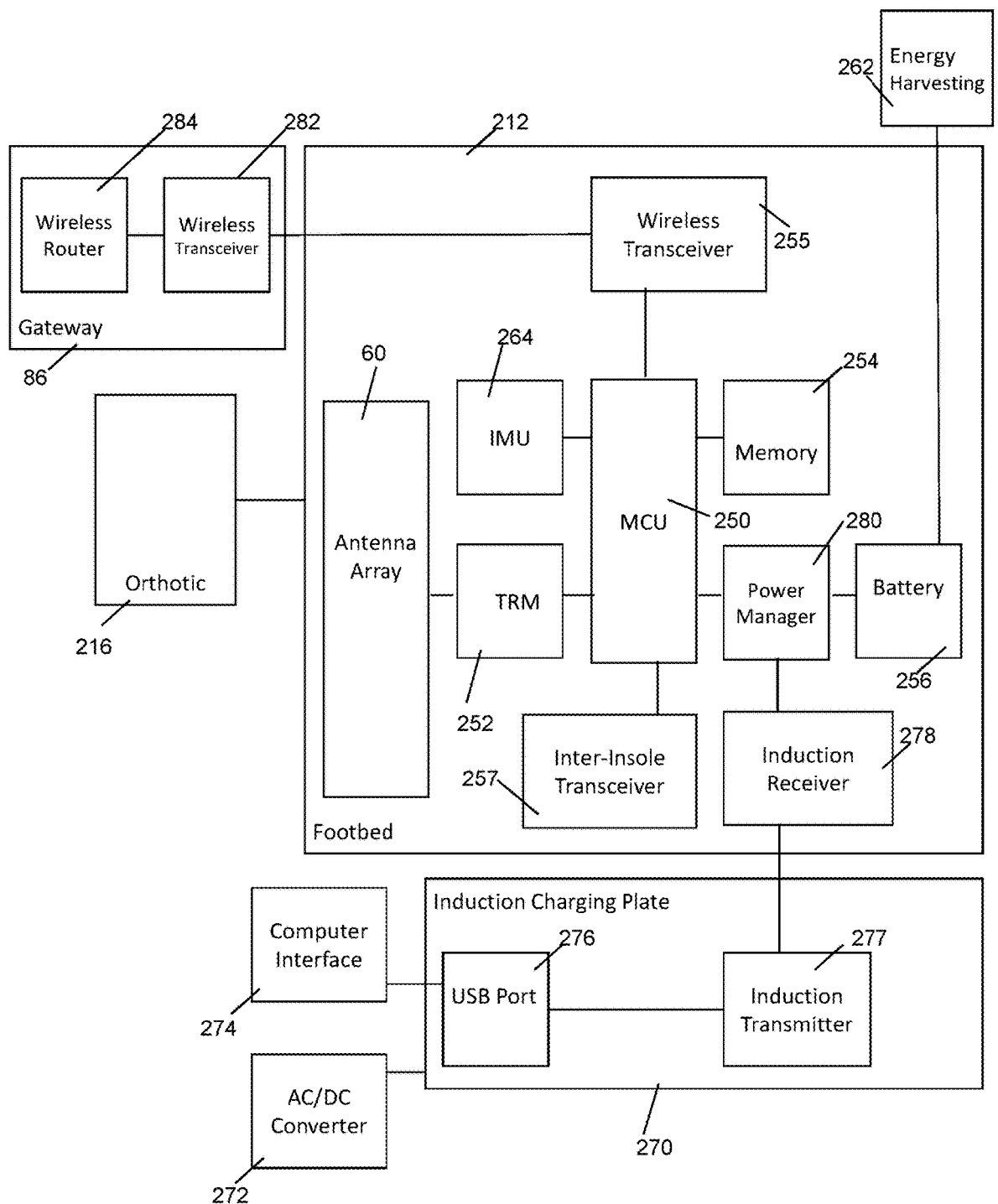
Figure 17:
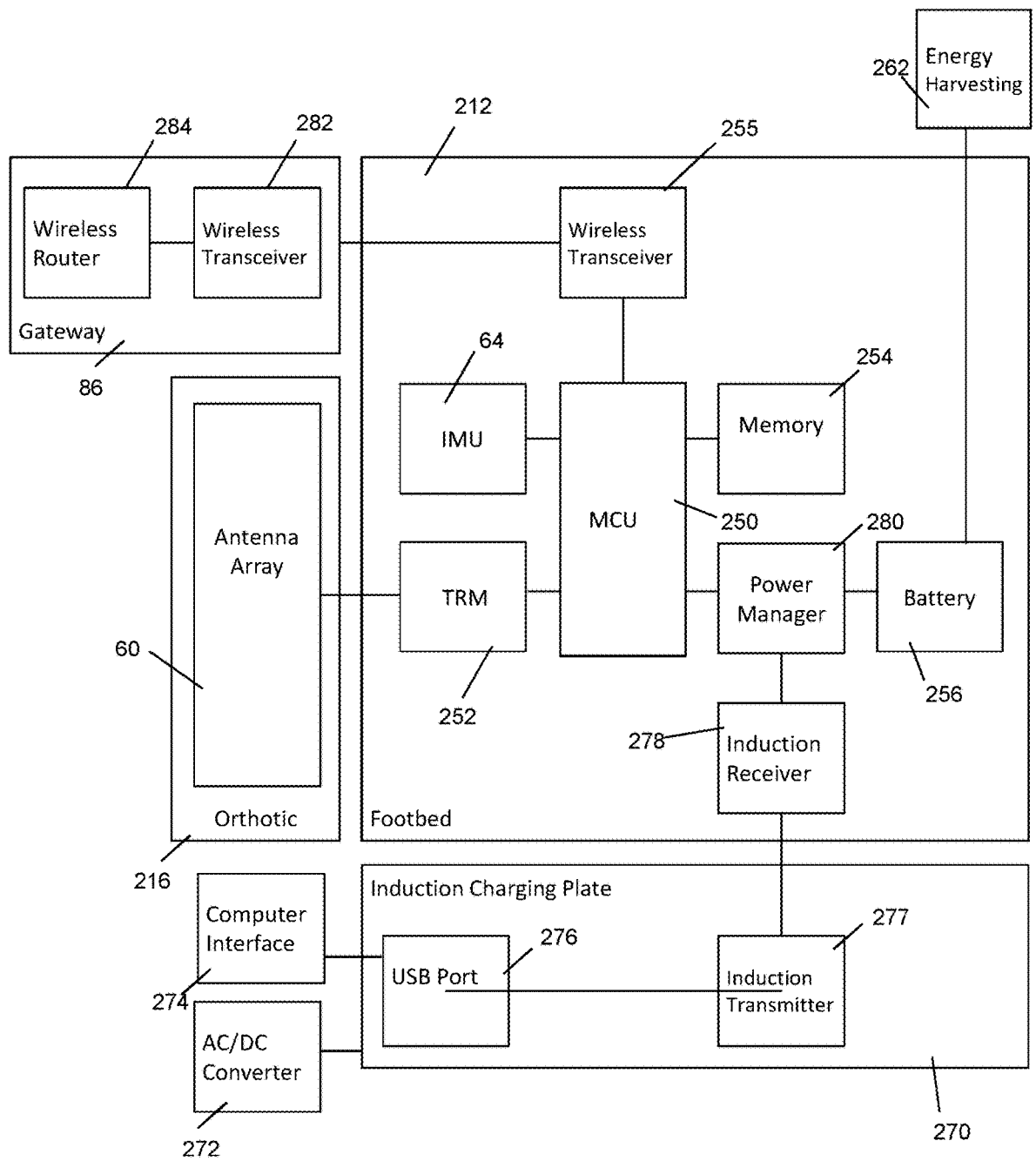

As shown in FIGS. 13 through 19, specific embodiments of the present invention comprise a device 100 and system for use with custom orthotics. The device can comprise a footbed 212 formed with at least one footbed e-system 214 embedded therein, wherein the footbed e-system 214 comprises at least one micro controller unit (MCU) 250, a radar sensor subsystem (e.g., Transmitter Receiver Module (TRM) 252 and 260), a memory 254, and a battery 256. In various embodiments, the radar sensor subsystem includes a UWB sensor subsystem comprising a pulse generator, transceiver, and an antenna arrangement 60 to transmit the generated pulses and receive pulse echoes. In other embodiments, the radar sensor subsystem includes a TRM 252. In some embodiments, the antenna arrangement 60 can be embedded within the footbed 212, and in other embodiments, the antenna arrangement 60 can be secured to the outer surface 213 of the footbed 212 and extend the length and width of the user's foot, for example. In still other embodiments, the antenna array 60 is positioned as a standalone object apart from an orthotic insole or insert 216 and apart from the footbed 212, or secured to the insole 216 (as shown in FIG. 17, for example). Regardless, the radar sensor subsystem is communicatively coupled to the footbed body 212 having the e-system 214. In various embodiments, the insole 216 comprises materials designed to optimize transparency to the generated pulses and echoes. The insert 216 can also be designed as a heat sink thereby improving the efficiency of the energy harvesting subsystem while providing the added effect of regulating foot temperature.

The antenna arrangement 60 can comprise a single antenna or an antenna array, including a fractal antenna array, for example. The antenna arrangement 60 can further comprise a configurable array of fractal antennas. It will be appreciated that the system is capable of operating in a passive mode using radio frequencies generated from sources other than the radar sensor subsystem, such as, for example, ultra-high frequency (UHF), super-high frequency (SHF), very-high frequency (VHF), and extremely high frequency (EHF) bands. The system is also capable of operating in an active mode generating pulses, and is further capable of determining when to switch between passive and active modes.

In various embodiments, a communications subsystem is provided as part of the footbed e-system 214. The communications subsystem can comprise hardware and software as embodied in wireless MCU 250 in FIG. 15 (and embodied in MCU 250 and wireless transceiver 255 in FIGS. 16 and 17), enabling communication from the e-system 214 in the footbed 216 to a computing device, such as a mobile communications device (e.g., smart phone) 90, a laptop, desktop, tablet or other computing device 92. In various embodiments, the communications subsystem comprises hardware and software enabling communication from the e-system in the footbed directly or indirectly to a central server 20 for use with the system of the present invention. Further, various embodiments incorporate an inter-insole transceiver 57 as part of the communications subsystem to permit communications back and forth between insole pairs associated with a user's pair of shoes, for example. The communications subsystem and/or radar sensor system can incorporate a separate transceiver using a wireless standard to facilitate this operation, such as Zigbee or 900 MHz, in various embodiments of the invention.

Figure 13:
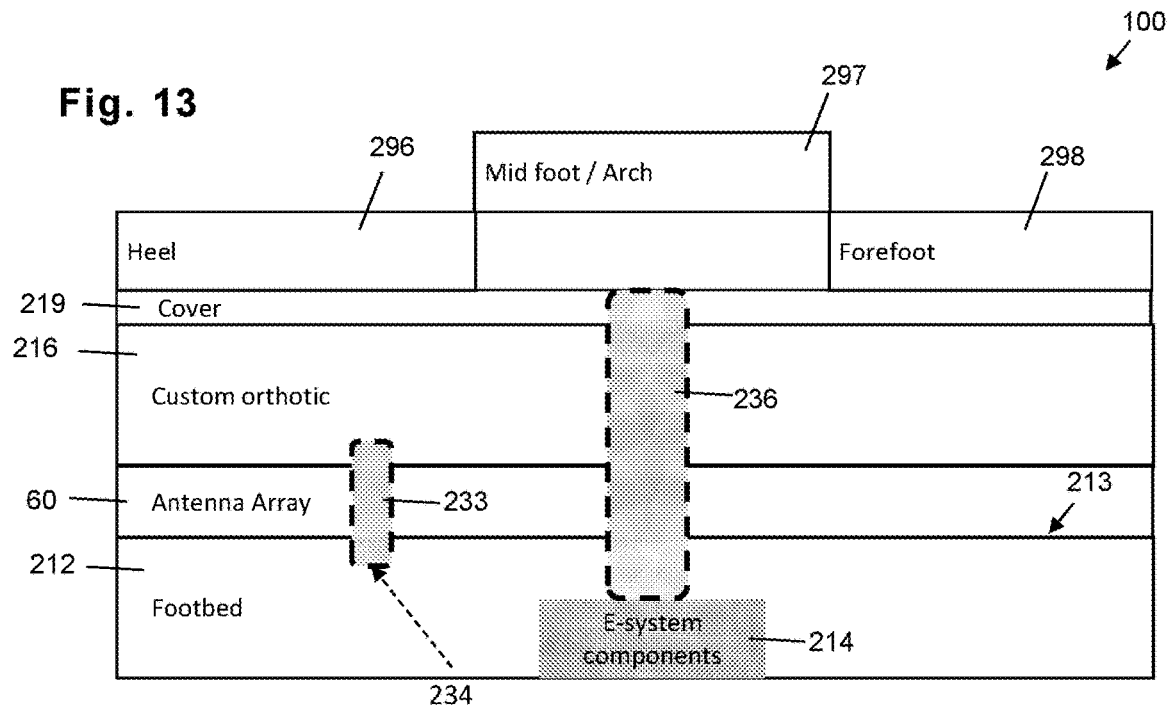
FIG. 13 is a side view of a schematic diagram illustrating components of a device according to embodiments of the present invention.
Figure 14:
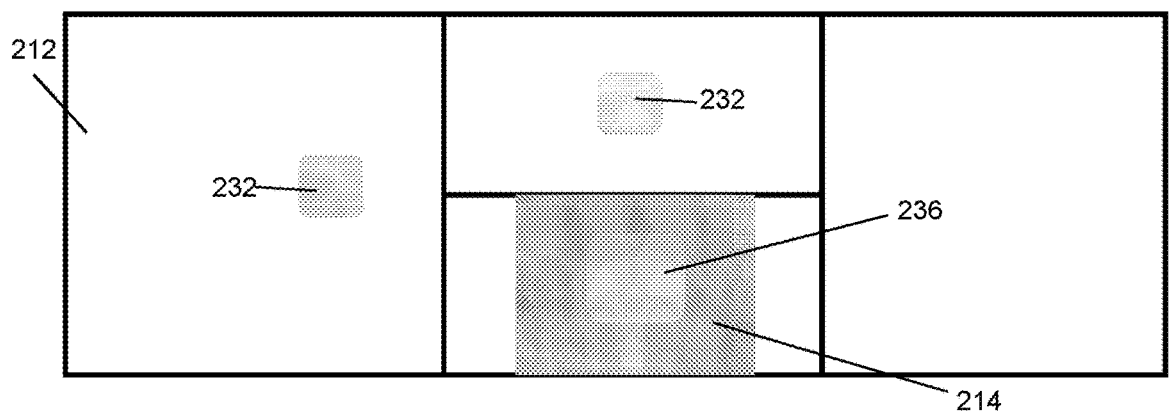
FIG. 14 is a top view of a schematic diagram illustrating components of a footbed according to embodiments of the present invention.

In various embodiments, the footbed e-system 214 further comprises an energy harvesting subsystem 262 and an inertial measurement subsystem (IMU) 264, as described elsewhere herein. The system of the present invention can use data from the IMU to compensate for variations in antenna orientation from the antenna array 60, according to aspects of the present invention. In various embodiments, the footbed e-system 214 can be embedded within the footbed 212 during an additive or other form of fabrication process. For example, a first portion of the footbed can be printed, manufactured and/or generated, then the e-system can be embedded in the first portion, and then a second and any subsequent portions of the footbed can be printed, manufactured and/or generated and joined with the first portion so as to enclose the e-system within the footbed. Further, in various embodiments, the footbed 212 can be secured to an orthotic (e.g., insole) 216 by providing a registration system for maintaining alignment of the footbed 12 and the orthotic 216. As shown in FIGS. 13 and 14, for example, the insole/orthotic 216, footbed 212, and any layers between the insole/orthotic and footbed (such as array 60) include one or more methods for preventing inter-layer movement, such as a registration system. As illustrated in FIGS. 13 and 14, registration posts 232 are provided in one body (e.g., the footbed 212) and mating registration openings, indentations or holes 234 in another body (e.g., the orthotic 216 and array 60) such that, when mated, the posts 232 engage the openings 234 to retain the bodies 212, 216, 60 together. A wiring/registration duct 236 can also be provided to facilitate registration and communication among various components in the device 100. The registration system according to embodiments of the present invention prevents relative movement between the footbed 212 and the insole/orthotic 216. As shown in FIG. 1, the registration system supports implementable sensor arrays 60 by providing a method for connecting these arrays (e.g., 60) to the footbed e-system 214. The registration system can also facilitate the connection of any other electronics housed in or on the insole/orthotic 216 to the e-system in the footbed 214.

According to various embodiments, a cover 219 can be provided on the insole 216 to protect the insole 216, protect any electronics housed in or on the insole 216 and to provide a desirable surface for a user who is wearing either socks or no other clothing between the user's bare foot and the insert. In various embodiments, the cover 219 may be a 3D fabricated material that is fabricated during the manufacturing process or applied as part of the assembly process according to aspects of the present invention. The cover 219 can also function as an energy harvesting subsystem which is capable of interfacing with the e-system 214 in the footbed 212 to charge the device 100 in-situ. In various embodiments, the cover can employ a fabric that converts heat and motion into electricity based on thermoelectric principles. In one embodiment, a cover fabric can be provided by International Thermodyne of Charlotte, N.C., USA. The device 100 can act as a heat sink to improve the efficiency of the cover's ability to generate electricity. A byproduct of this arrangement is that the user's foot can be warmed and cooled as desired. The generated electricity can be used to charge the battery 256 via the wiring/registration duct 236 in the device 100, and can further be integrated with power management component 280 to regulate and monitor the generated electricity and charge of the battery 256.

In an exemplary embodiment, as shown in FIGS. 15 through 17, a device according to the present invention can include an induction charging plate 270 for charging insoles associated with the present invention. The induction charging plate 270 can be connected to an alternating current (AC) power source, wherein an AC converter 272 can auto-detect the voltage. In various embodiments, the induction charging plate can be powered from a powered USB computer interface 274 connected to a USB port 276 on the plate 270. The plate 270 is capable of accommodating 110/220 volt 50/60 Hz power sources, for example. Insoles contained in target shoes can be removed and matched to insoles provided as part of the device of the present invention such that, using the existing insole as a template, a user can trim the device's insoles to fit the target shoes. The user places the device's insoles into the target shoes and places them on the induction charging plate 270. The induction charging plate 270 recognizes the presence of the insoles and begins the charging process using an induction transmitter 277 transmitting the charge to the induction receiver 278 on the footbed 212. A related software application can track the charging status of the insert(s) and notify the user, for example, should the user activate this option. The induction charging plate 270 and battery 256 can form elements of a power management component 280 on the footbed 212. The power management component 280 can also communicate the charge status for the inserts to the server 20 or a separate computing device 90, 92 associated with aspects of the present invention.

When the inserts have charged sufficiently, a diagnostic test can be performed to confirm that the e-system circuitry is performing within specification. The inserts can pair with a target smart device 90 or other computing device 92 via a wireless protocol, such as Bluetooth, for example. The diagnostic then tests the sensor array 60 to identify any missing or failing sensors. The device remaps the sensors, determines if the array can perform within specification and to what extent. The device creates and stores a diagnostic log and notifies the user. If the device is not performing within specification, the user is given the option to continue using the device, view the diagnostic report, and/or upload a report to an associated service center for resolution. Once the diagnostic testing is successfully passed, the inserts finish charging and a progress report and/or alert can be sent to the user when charging is complete.

The user then places the shoes on his/her feet and follows a calibration process as specified by the mobile application, for example. Upon completion of the calibration process, the user performs a desired activity such as exercise, work, recreation or stress test, for example, while the footbed collects and stores data from the IMU and radar sensors and uploads it to the user's smart device for preliminary processing. The data can independently be delivered to one or more associated servers for preliminary and primary processing. Communication from the footbed 12 to the smart device 90 or computing device 92 can occur via a wireless MCU 250, as shown in FIG. 15, or via a wireless transceiver 255 that is part of footbed 212 communicating with a wireless transceiver 282 combined with a wireless router 284 that are part of a wireless gateway 86 associated with embodiments of the present invention, as shown in FIGS. 16 and 17.

It will be appreciated that the data can be processed locally and/or remotely providing the user both real time biofeedback (should this option be selected) and performance data and post event results. This biofeedback can be tailored by the analytics component 23 of server 20, for example, to reduce the risk of repetitive stress injuries, accelerate rehabilitation, and optimize performance, as described elsewhere herein. The biofeedback is based on real time and historical biometric, musculoskeletal, and environmental data and user goals and objectives, which can be stored in and accessed from database 33. The user can select to share the collected data with one or more individuals such as HWF professionals, peers, family and friends, for example, via admin component 21 of server 20. The user can also create activity profiles and share data based on activity and an individual or groups of individuals via admin component 21 of server 20. The user can also choose to share their de-identified data with HWF professionals and researchers through a database and related service focused on improving diagnostic and treatment via admin component 21 of server 20.

In various embodiments, a device 100 according to the present invention can be worn as an insole in footwear, either as an accessory replacing pre-existing insoles or integrated into new footwear. Such a device measures a wide range of physical and biometric parameters over the heel 296, mid-foot/arch 297 and forefoot 298 portions of a user's foot, as shown in FIG. 13, for example. These parameters, when analyzed by the analytics component 23, can be used to improve the design and manufacture of custom orthotics, track orthotic-shoe performance, predict and mitigate repetitive stress injuries, optimize rehabilitation, exercise and training, and performance, improve diagnostic and treatment capabilities, extend HWF to disadvantaged individuals through telemedicine and provide emergency response, for example.

In various embodiments, a user can first remove the insoles in their existing shoes. Next, one at a time, the user can place the existing insole back-to-back with the device's insole and trim the device's insole to match the existing insole. The user does not need to worry about damaging the sensors associated with the invention's insole as the sensor array is self-healing and can be re-mapped during the diagnostic process. It should be noted that the user can complete this step with or without the footbed in place. In the embodiment of the present invention employing a registration system of pegs in the footbed with holes in the insole, if the user prefers to trim the invention's insole without the associated footbed, then the user can snap the orthotic back into the footbed matching the registration holes in the insole with the registration pegs on the footbed. It will be appreciated that the registration system can incorporate a hook-and-loop type of fastening arrangement and could be 3D printed as part of the component in various embodiments of the present invention.

The registration system also acts as an interface between the footbed e-system 214 and the sensor array 60 should the sensor array 60 be surface mounted to the insole 216, as illustrated in FIG. 13. The registrations posts 232 also inhibit movement of the orthotic insole and footbed in the shoe. It will be appreciated that no trim-to-fit process is required in various embodiments of the present invention. Once the invention's insole has been trimmed to fit and re-installed into the shoe, the shoe is placed on the induction charging plate 270. The induction charging plate 270 may or may not be plugged in. If the induction charging plate is not connected to an AC power source 272, then the user connects the induction charging plate through a USB interface 274 to an AC power source. The induction charging plate 270 will either wake-up from a sleep mode, if already connected to an AC power source, detect the invention's insole and begin charging or, in the case of the former scenario run a diagnostic, enter the ready state, detect the invention's insole and begin charging. During charging, a visual gauge on the charging plate can indicate progress. Once the invention's insole has charged sufficiently it will run a diagnostic that tests all circuitry, tests the sensors and sensor array, stores a diagnostic report then pairs with the user's smart device 90 and or computer 92, at which point the user will receive a diagnostic report and charging status, as noted above. If the user interface provided as part of admin component 21 of the system 40 is open, the user can see a visual progress bar/fuel gauge and diagnostic status at any time, for example.

The diagnostic process associated with administrative component 21 can re-map the sensor array 60 based on missing sensors resulting from the fitting process. It can also identify any inoperative or failing sensors, remap the array, assess any changes in data quality, and notify the user through the diagnostic report. Should a sensor become inoperative or begin to fail during use, the system will adjust, assess any changes in data quality, and notify the user. Upon completion of the diagnostic process, the user puts on the shoes. The insoles lead the user through a calibration process which can also be initiated manually by the user through a mobile application provided as part of user component 21, for example. Upon completion of the calibration process, the user performs his/her activities. The user has the ability to set up/select activity profiles via admin component 21 and use them to set application behavior such as parameter tracking, data visualization, and biofeedback, for example. Regardless of the selected profile, all data is collected by and stored in the database 33, and can be uploaded to a smart device 90 and/or other computing device 92. Cloud-based servers can also be employed as direct or indirect recipients of the data. The data collection, storage, and processing can occur while the user performs a desired activity or activities and or post-event. The user can view any of the parameters tracked and resulting insight if they have a related widget from widget component 22 assigned to their account, such as through a subscription, for example. If the user desires to view data associated with a parameter not currently tied to their account, the user can obtain a new widget, such as by purchasing a subscription for the associated widget or swapping out an existing widget for the new one, for example. In the case of an orthotic assessment, the analytics component 23 will analyze the related data, determine the need for an orthotic, and if needed, the design component 27 can design a custom orthotic based on the data collected, historical data, and, if appropriate, user base data related to similar activities.

In the case of a user needing a custom orthotic, the system 40 can generate a report via design component 27 illustrating and detailing the design, explaining the rationale, providing data and insight related to the associated parameters, and offering the user the option to share this data with designated individuals within their community, and the option of purchasing the custom orthotic.

In various embodiments, the manufacturing component 28 according to aspects of the system 40 of the present invention selects the appropriate materials from the system's materials library (stored in database 33, for example), and determines whether a single or mixed material design best suits the design. Further, the manufacturing component can determine the appropriate material constituency for the orthotic. In the case of a single material design, the manufacturing component 28 determines the appropriate structural variations that best meet the design criteria. In the case of a mixed material solution, the manufacturing component 28 determines the appropriate mix, placement, distribution, and densities of each material and related structural variations. Embodiments of the distribution component 29 of the system 40 provide automated supply chain management across the product's lifecycle from manufacturing, fulfillment, after sales support, and end-of-life.

In various embodiments, the system 40 according to aspects of the present invention improves its capabilities over time and as the user base and user data increases, as described elsewhere herein. When the new custom orthotics are complete, the user is notified and asked to confirm the delivery option, which is then executed. In all use cases, the user has the ability to select what data they want to share. Once selected, recipients receive an invitation to download the mobile and or web application, set up an account, user profile, activity profiles, and community through administrative 21 components. The system 40 can automatically connect individuals that have received and accepted invitations. Recipients, such as healthcare professionals, can identify the parameters they want to track, set notification thresholds for each parameter and associate actions with notifications and set default actions based on notification characteristics via admin component 21.

In various embodiments, aspects of the present invention provide a modular insert device, expert system with mobile and web based interfaces, and a distributed manufacturing system, which can employ additive, subtractive or combined additive-subtractive manufacturing.

As described herein, embodiments of the present invention thus can provide a modular orthotic device including a footbed 212 containing at least one e-system 214, and a replaceable orthotic insole 216. The custom orthotic can be designed to be worn with or without the footbed giving the user the ability to have multiple orthotics without having to have multiple footbeds. The user can combine the footbed with the orthotic at any time, should the user want to collect data related to that orthotic and shoe. The footbed and standard orthotic can be constructed using additive or subtractive printing, or hybrid additive/subtractive printing, for example. In various embodiments, the antenna array 60 associated with the sensor system can be printed as part of the footbed additive manufacturing process. The orthotics 216 can be either constructed of a single material or mixed material. In the case of the former, the structure is modified to create the desired properties. In the latter selection, placement, quantity, density, and structure of the various materials are used to create the desired properties. These properties include, but are not limited to, resilience, flexibility, shock absorption, energy transmission, electrical conductivity, bacterial and odor resistance, thermal conductivity. The e-system 214 can be environmentally hardened by being encapsulated within the footbed 212 during the manufacturing process, in one embodiment. The e-system-sensor array interface can optionally employ a quick-release mechanism that permits easy and quick replacement of the sensor array 60 or footbed 212, for example.

In various embodiments, the insole has two sensor systems, wherein the first is an inertial measurement system (IMU) consisting of a 3-axis accelerometer, 3-axis magnetometer, and 3-axis gyroscope to measure orientation and location (e.g., by dead reckoning) and the second is a radar subsystem, such as an Ultra Wideband (UWB) imaging system. Unlike other sensor technologies, the UWB sensor system accuracy does not require that the sensors be placed on the surface of the orthotic so the sensor array can be placed under the orthotic and still deliver clinical grade data. The UWB sensor system according to aspects of the present invention comprises a pulse generator, transceiver, and a configurable array of fractal antennas to transmit the generated pulses and receive pulse echoes. The UWB sensor system can configure itself to minimize power consumption, achieve the necessary resolution, and adjust a variety of parameters during, pre-, and post-data collection including, but not limited to, pulse rate, pulse duration, pulse strength, multiplexing such as orthogonal frequency division multiplexing (OFDM), multiple input multiple output (MIMO), beam forming, synthetic antenna aperture, combination of successive recorded echoes, auto-correlation, and image fusion.

In various embodiments, each insert device 100 has onboard memory used to store sensor data and diagnostic logs for the purposes of backup, retransmission, and for post-event upload. Each insert has the ability to communicate wirelessly with its insert mate and synchronize activities, as shown and described in connection with FIGS. 15 through 17. Each insert can also communicate with smart devices 90, other computing devices 92, other wearable devices 94 and emergency services 96 to upload sensor data and diagnostics for analysis. The system 40 can also communicate with cloud-based servers. In various embodiments, the device 100 can connect directly with a cellular network to provide location services and emergency response 96, for example. In various embodiments, each insert has onboard memory 254, and can store sensor and diagnostic data using lossless data compression. In various embodiments, each insert incorporates a thermodynamic energy harvesting subsystem that is used to extend the life of the onboard battery 256 and provide heating and cooling of the foot, as noted elsewhere herein. Additionally, each insert can support induction charging via device 270 as noted elsewhere herein.

In various embodiments, the insert's embedded processor 250 manages insole functionality including, but not limited to, on, off, sleep, energy management, charging, calibration, diagnostics, transceiving, pairing, inter-insole synchronization, sensor fusion algorithms converting IMU data into quaternions and data storage, for example. Further, each insert can adjust sensor resolution and sample rate by zone and identify failed and failing sensors, remap the sensor array, calculate the level of accuracy, compensate for degraded accuracy, and notify user of changes, recommend actions, and notify customer support. Additionally, each insert can use algorithms such as provided via analytics component 23 of server 20 to constantly improve and optimize data collection quality, determine system health, optimize its performance, protect data, and record system health and notify the user of future issues.

In establishing an account for use with embodiments of the present invention, a user can download a mobile web application provided through the administration component 21 to their device (e.g., 90 or 92), optionally create a user account and receive a validating message such as an e-mail or text message with a link to their account associated with the system 40 of the present invention. The user can then access their account and set up a password via admin component 21. The user can also create a user profile, optionally multiple activity profiles, and optionally their community members via admin component 21. The user can also request that various software services by provided, such as individual or bundled data widgets, for example, from widget component 22. The user can further personalize their dashboard visual interface via admin component 21.

If the user is using the system 40 and device 10 according to aspects of the present invention to design a custom orthotic, then the system will notify the user when it has sufficient data to execute the design based on optimizing free motion and foot muscle activation, for example. In various embodiments, this may require a series of orthotics to reduce dependency.

The system 40 can collect environmental, neurological, bio-mechanic, kinetic, and physiological data that is used in the evaluating the need for and design of custom orthotics and assessing and improving musculoskeletal and physiologic performance, for example. In various embodiments, the orthosis could be a single piece with the e-system embedded in the orthotic or embedded in the orthotic in a way that allows it to be removed should the orthotic need to be replaced. The sensors, the orthotic, and the e-system can be disposable, or the e-system and sensors can be removed from an orthotic and installed into a new orthotic, according to various embodiments of the present invention.

The system 40 can also generate a report via analytics component 23 and/or design component 27, for example, that includes, but is not limited to, showing the recommended custom orthotic, providing a rationale behind the design, identifying risks for repetitive stress injuries, and providing performance and performance improvement data and recommendations, effectiveness assessments, and recommendations for meeting pre-determined goals and objectives. At the completion of the process, the user is offered the opportunity to upload the data to their selected community members and purchase the custom orthotic via admin component 21. If the user chooses to purchase the orthotic, then the user may proceed through an online transaction experience. Upon completion of the transaction, the distribution component 29 can locate the nearest available or most suitable printer for the customer and uploads the file developed by the manufacturing component 28 for printing. The user's order is confirmed and sent to the user along with delivery options including an option to pick up the custom orthotics, such as through administrative component 21. The user can also be sent progress reports from the administrative component 21 as the custom orthotic is printed and prepared for delivery. Upon receipt of the custom orthotics, the user can wear the custom orthotics 216 either with or without the footbed 212. In the former option, the user removes the device's inserts from the target shoes, removes the existing orthotics from the footbeds and replaces them with the new custom orthotics. It will be appreciated in certain such instances that a physical spacer may or may not have been in place within the shoe to take the place of where the footbed would have been. In the latter option, the user places the orthotics in the target shoes as with a traditional orthotic or inserts and uses the footbed with original or custom orthotics in another pair of shoes such as athletic shoes where the need for continuous data collection, analytics, and biofeedback is greater.

The option to use the custom orthotic 216 with or without the footbed 212 minimizes cost and gives the user flexibility. In the case of casual shoes, the user may only want to collect data on a periodic basis to confirm the performance of the shoe and orthotic and determine if there is a need to replace either.

Figure 18:
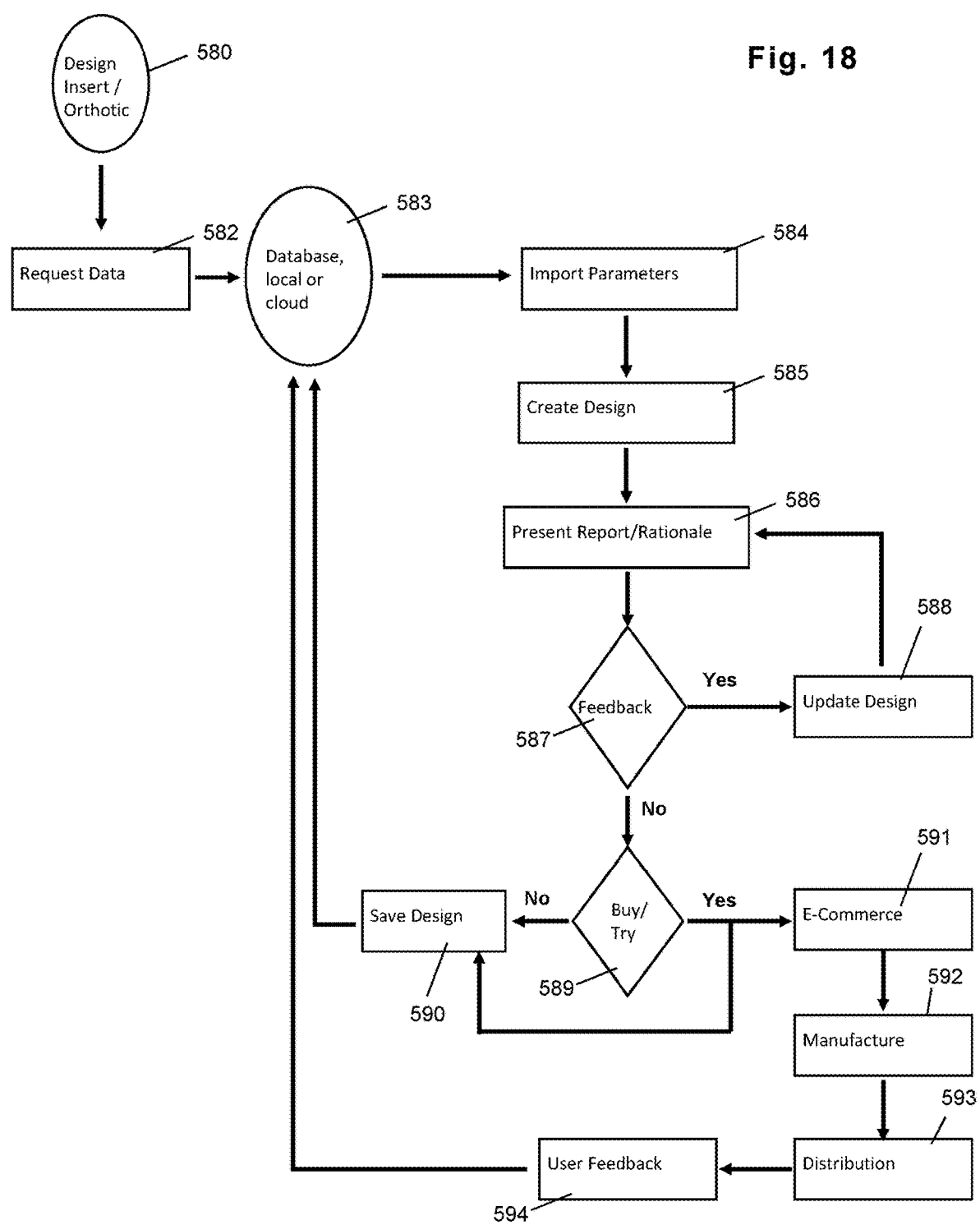
FIG. 18 is a flow diagram illustrating a custom orthotic insole creation process according to embodiments of the present invention.

FIG. 18 is a flow diagram illustrating specific processes associated with embodiments of the present invention as employed to develop an orthotic insole. As shown therein, a request is received by the system to design an orthotic insert, as at 580, and appropriate data is requested as at 582 by the system from libraries 33 as at 583, for example. The data can be requested from libraries and includes data collected by sensors located on the device or remotely from the device, for example. Once relevant data is captured, suitable parameters are imported as at 584, and an initial design is created as at 585. A report and rationale for the design can be developed as at 586, and feedback can be solicited from a user as at 587. If feedback is provided, the design can be updated as at 588. If no feedback is provided, the user can be presented the opportunity to buy and/or try a device manufactured according to the created design, as at 589. If the user declines, the design can be saved as at 590 and stored in an appropriate library for later use in step 583. If the user accepts, the design is also saved at 590, and appropriate e-commerce activities transpire as at step 591, wherein the product is then manufactured at step 592 and distributed at step 593. User feedback can be acquired by the system at step 594, including sensor-obtained feedback and/or qualitative user feedback, and such feedback is further stored in an appropriate library for later use in step 583.

Figure 19:
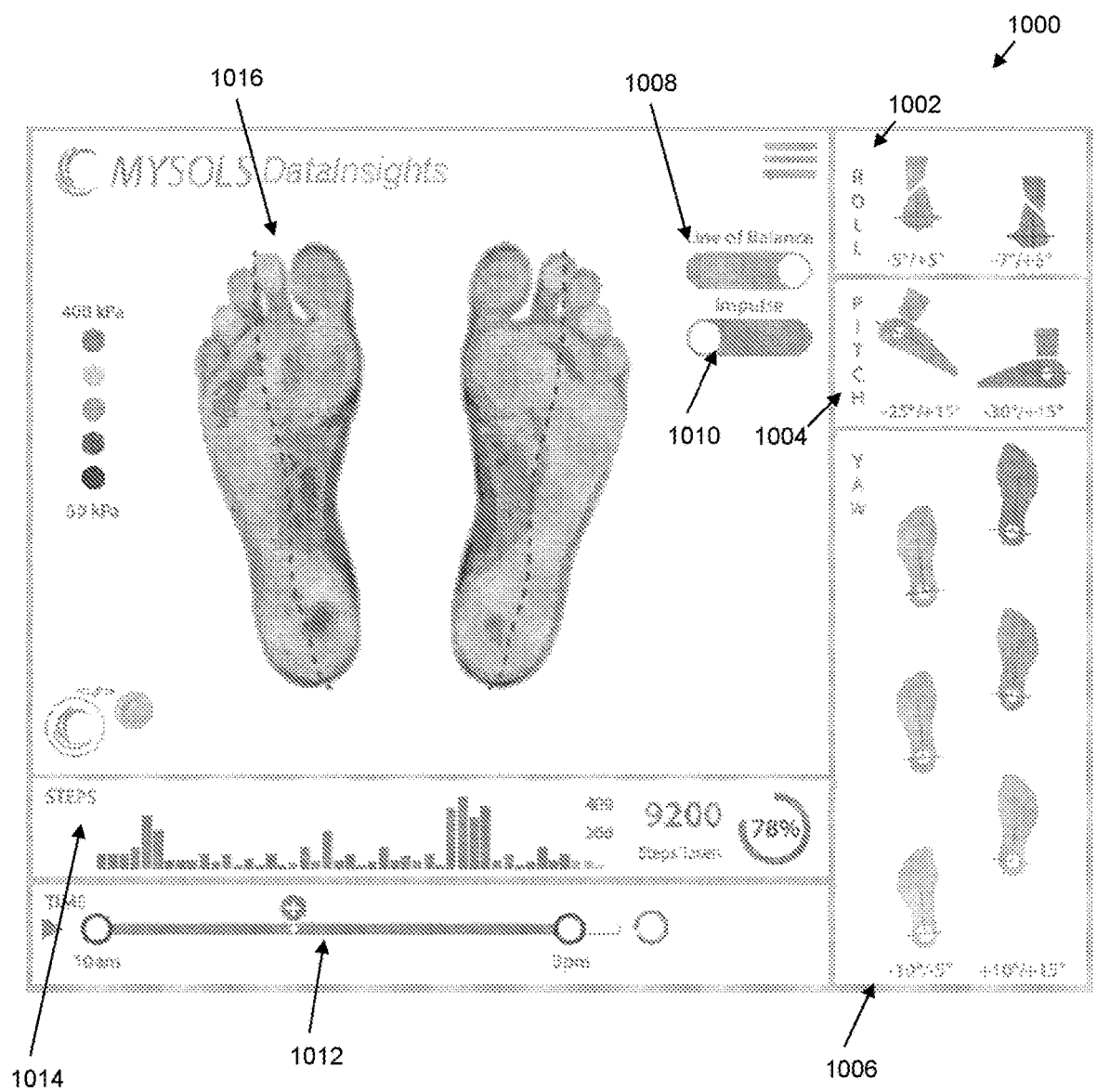

FIG. 19 illustrates a user interface 1000 associated with embodiments of the present invention, such as may be employed in connection with a custom orthotic insole, for example. As shown therein, the user interface 1000 includes widgets for roll 1002, pitch 1004 and yaw 1006 foot movements, as well as widgets for line of balance 1008 and impulse 1010 data. An elapsed time graph 1012 is also shown, along with a steps counter 1014 and foot pressure map with a heat-map type display 1016, indicating what portions of the user's feet are bearing the greatest weight. A user can use the system of the present invention to display many other widgets, and users may have different purposes associated with what is displayed on their customized user interface. For example, a HWF professional and an end user may wish to see different data.

FIGS. 20 through 37 illustrate additional interfaces associated with embodiments of the present invention, including exemplary widgets, widget use, and communicate options for a user tied to a user's personal network, such as communications involving a HWF professional through a compliant (HIPPAA & HITECH) system, for example.

Figure 20:
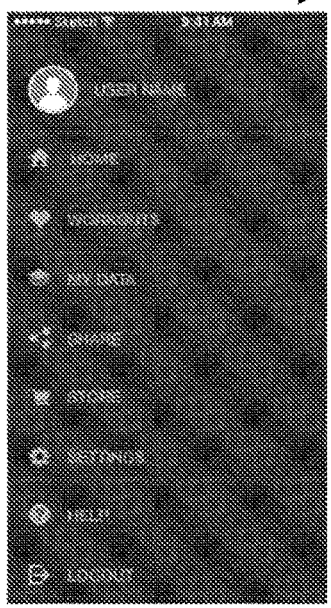
Figure 23:
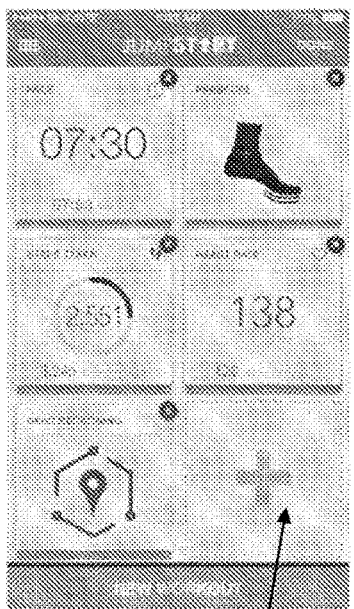
Figure 24:
Figure 25:

As specific examples, FIG. 20 illustrates a user interface 1100 showing overall menu options for a user according to embodiments of the present invention, including a user home page, a personalized workout component, a personalized data component, a sharing component, a store component (such as to add widgets, for example), a settings component, and "help" and logout components. FIG. 21 illustrates a user interface 1110 showing which widgets a user is currently subscribed to, and which can be added, according to embodiments of the present invention. FIG. 22 illustrates a user interface 1120 similar to FIG. 21, with a particular widget, "shear reaction force", having been added from the widget options according to embodiments of the present invention. FIG. 23 illustrates a user interface 1130 showing five specific widget details and an icon 1132 for a user to add a widget according to embodiments of the present invention. FIG. 24 illustrates a user interface 1140 showing six specific widget details for a user according to embodiments of the present invention. FIG. 25 illustrates a user interface 1150 showing six specific widget details for a user, including a "calories burned" widget 1152 replacing the "shear reaction force" widget 1142 of FIG. 24.

Figure 26:
Figure 27:
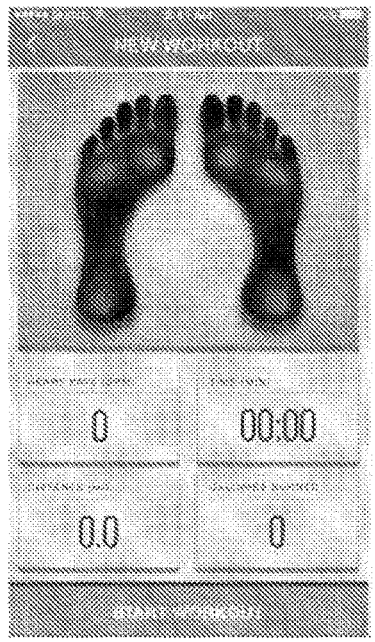
Figure 28:
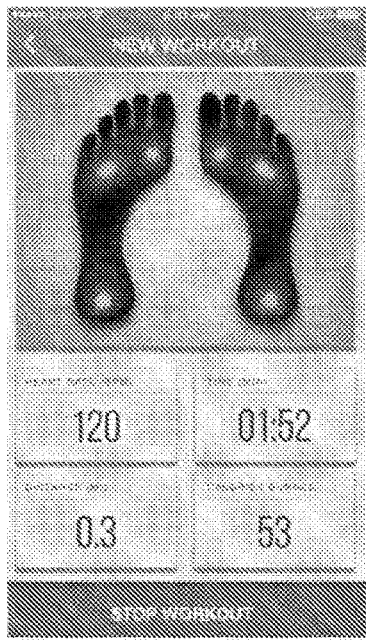
Figure 29:
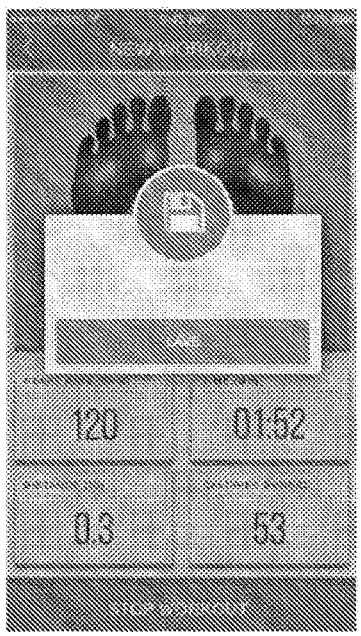
Figure 30:
Figure 31:
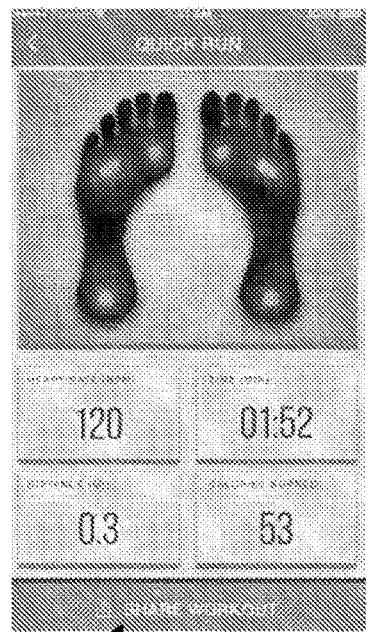
Figure 32:
Figure 33:
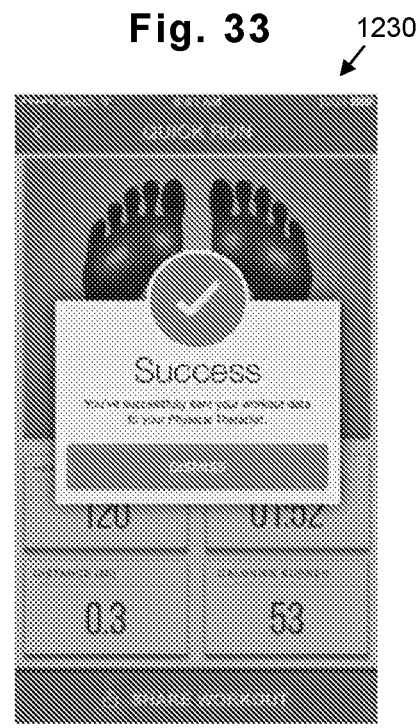
Figure 34:
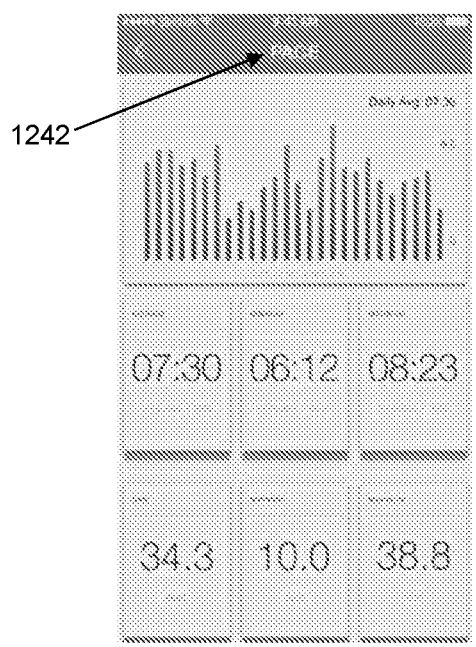
Figure 35:
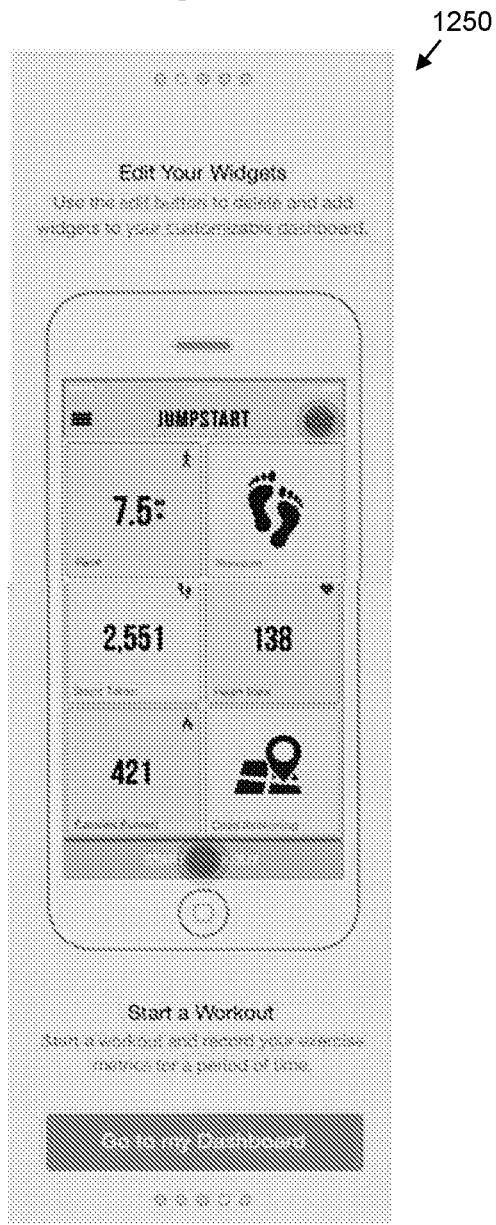
Figure 36:
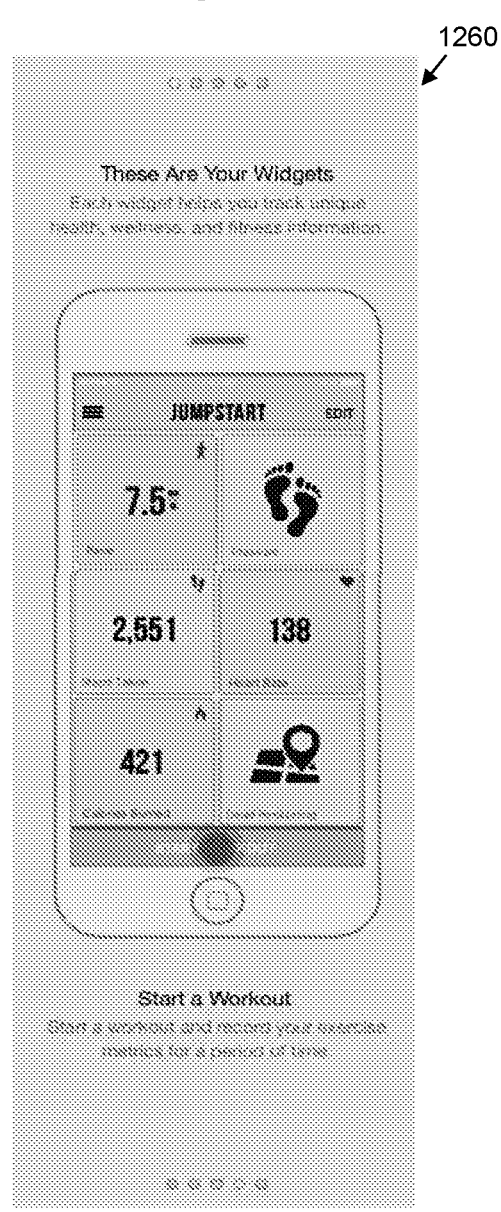
Figure 37:
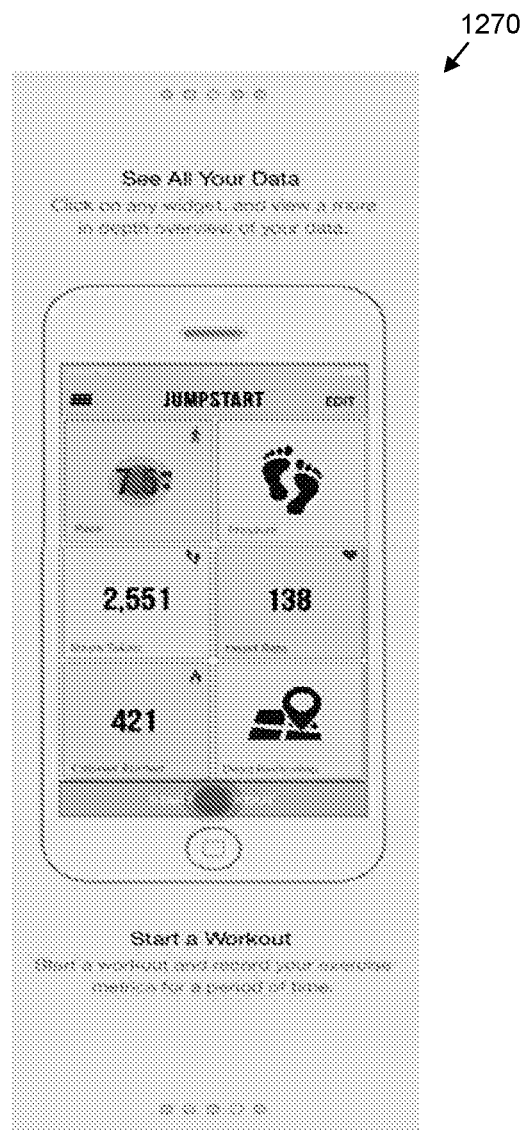

FIG. 26 illustrates a user interface 1160 showing a user's specifically tracked data according to embodiments of the present invention. FIG. 27 illustrates a user interface 1170 showing widgets and details for a user prior to a workout according to embodiments of the present invention. FIG. 28 illustrates a user interface 1180 showing widgets and details for a user during a workout according to embodiments of the present invention. FIG. 29 illustrates a user interface 1190 showing a user in the process of saving a workout and/or related details according to embodiments of the present invention. FIG. 30 illustrates a user interface 1200 showing a user in the process of saving a workout and/or related details using a file name, according to embodiments of the present invention. FIG. 31 illustrates a user interface 1210 showing a selection option for a user to share his or her workout, according to embodiments of the present invention. FIG. 32 illustrates a user interface 1220 showing menu options for a user sharing his or her workout according to embodiments of the present invention, including a selection option 1222 to send workout details to a team, a selection option 1224 to send workout details to a coach and a selection option 1226 to send workout details to a physical therapist, for example. FIG. 33 illustrates a user interface 1230 showing a confirmation message that a user's workout has been successfully shared with the user's physical therapist, according to embodiments of the present invention. It will be appreciated that the user's physical therapist can invoke subsequent operations according to embodiments of the present invention, including, for example, tracking the user's progress against a therapy program. FIG. 34 illustrates a user interface 1240 showing statistical details for a user tied to a specific widget (e.g., running pace 1242) according to embodiments of the present invention. FIG. 35 illustrates a user interface 1250 showing the ability for a user to edit his or her widget options according to embodiments of the present invention. FIG. 36 illustrates a user interface 1260 showing the ability for a user to review his or her widget options according to embodiments of the present invention. FIG. 37 illustrates a user interface 1270 showing options for a user to reveal more details about a particular widget from a set of user widgets, according to embodiments of the present invention.

Exemplary Use Case: Health-Wellness-Fitness (HWF) Professional

In accordance with various aspects and embodiments of the present invention, the system 40 can send a HWF professional an invitation from the user via a software application as part of the administrative component 21 of the present invention. In various embodiments, the HWF professional may "subscribe" to the appropriate SaaS package or, as in the case of a larger group, pick the appropriate package or data widgets from the widget component 22 in accordance with embodiments of the present invention. The HWF professional can set up an account, profile, and community using the admin component 21 of the system of the present invention, wherein the community may include other HWF professional and their patients/clients, for example. The HWF professional can then identify the appropriate parameters to be tracked, set parameter notification thresholds, and notification actions for each patient/client and HWF professional associated with that patient/client. If the patient/client is not a user of the system of the present invention, then the HWF professional can invite the patient/client to become a user. In this case, the patient/client would go through the typical on-boarding process. The system of the present invention can also facilitate billing and insurance functions, for example, through the HWF professional's billing process and/or external systems 35 in communication with the server 20 of the present invention.

The user, as part of the on-boarding process and via admin component 21, can opt-in to share their data with the HWF professionals identified by the sponsoring HWF professional. The user has the ability to determine who receives data, what data is shared, under what circumstances, and for how long. For example, a user with a knee injury may decide to share data related to the knee injury and its rehabilitation with the physician, physical therapist, personal trainer, and coach and make those connections perishable based on when the system determines the knee has recovered, a specific date, or manually. The user also has the ability to add or remove HWF professionals and others including sharing their de-identified data for research, for example. Users and HWF professionals also have the option of associating members of their community to an issue, objective, goal profile. For example, musculoskeletal issue, running a ten kilometer race in thirty minutes, optimizing recovery, improving form, optimizing performance and behavioral modification may all be part of a user's goal profile. The HWF professional can, with the user's permission, use the user's real world data to enhance diagnostic and treatment capabilities to assess progress and efficacy and predict outcomes. The HWF professional can do this based on a patient's/client's near-term and or historical data and or accessing the de-identified data of their patient/client base, patients/clients within their clinic's/medical system/network and or the entire user base of the system. It will be appreciated that only data from users that volunteer their de-identified information are included in this database 33. The system can analyze all of the user de-identified data and input from HWF professionals to improve the invention's capabilities and accuracy.

Exemplary Use Case: Retailers and Shoe Manufacturers

Shoe retailers and manufacturers can use the various embodiments of the present invention to create off-the-shelf custom fitting shoes using user provided data stored in database 33, for example. The user can be provided with a rank-ordered list of functionally fitting shoes, for example. The system according to aspects of the invention can determine if a custom orthotic design would optimize the fit and offers this option to the user. If selected, the custom orthotic is printed and added to the shoe while the user waits, in the case of a brick and mortar scenario or shipped to the user, in the case of an online scenario. Manufacturers can employ various embodiments of the present invention into their shoes during the development and production process. New users can then go through the typical process for identifying the need for and design of a custom orthotic. In the case of existing users, a semi-custom or custom orthotic based on the user's data can be shipped as part of their new shoes.

In all scenarios, the retailer and manufacturer can create a mass personalization model supporting a personalized shopping experience in accordance with embodiments of the present invention. In the case where a user or HWF professional has the appropriate equipment, an online library of printable shoes can be maintained in database 33 and printed by the user, retailer or HWF professional, for example.

Exemplary Use Case: Athlete

Athletic coaches can use the real time data and analytics from embodiments of the invention to track and assess a range of parameters in real-time and post-event including, but not limited to, athlete and team performance, and performance optimization injury risk, exercise and training effectiveness. Aspects of the invention provide a personalized dashboard as part of admin component 21 and/or coach component 30, giving users/HWF professionals information they need in the way that makes the most sense to them. Analytic processes available through analytical component 23 of the system of the present invention can be designed as widgets that can be used as groups or individually. Access to visual dashboard administration and widget component 22 enables selection of pre-bundled widgets and the entire library of individual widgets. The user/HWF professionals can then manipulate (e.g., drag and drop) the widgets to organize them to meet their need and the way they like to receive information. Widgets can be manipulated, combined and customized using the widget optimizer component 25. The user/HWF professionals can further use optimizer component 25 to link widgets to create new information such as power by linking torque and rpm widgets, for example. Users/HWF professionals can choose to drill down into increasingly finer detail by clicking on a dashboard or widget, for example. Embodiments of the system learn from the dashboard design and user interaction to determine which insights are desired and to recommend dashboard designs to optimize interaction. The user/HWF professional also has the ability to use the interfaces associated with the system of the present invention to select preferred data visualization options including, but not limited to, color schemes, format, and representation, for example. The user/HWF professional can also set these options as defaults by a range of attributes such as individual patient/client/athlete, group/team, particular issue/goal/objective, performance. Defaults can be created and the system can pre-populate information to accelerate administrative functions.

Exemplary Use Case: Health/Disability Related Symptom Reduction

In various embodiments, the present invention can notify users/HWF professionals via administrative component 21 to risks such as foot ulceration in people with neuropathy, for example. Aspects of the present invention can also provide information to improve motor skills in stroke victims and individuals with musculoskeletal issues such as muscular dystrophy and cerebral palsy, for example, and can be used to mitigate symptoms of joint related issues such as arthritis and injury, for example. Aspects of the present invention can also provide information to assist people with autism in knowing when they are becoming emotionally agitated so that they can perform calming routines, for example. In the case of age-related diseases such as dementia, in order to mitigate falls, aspects of the present invention can also assist care givers and family members in remote monitoring. This can include preventing and predicting falls in the elderly, sending notifications to care givers and family members. The dead reckoning capability allows care givers and family members to track at-risk individuals in conjunction with or without other systems such as GPS, for example.

Exemplary Use Case: Occupational Health & Safety

In various embodiments, the system 40 provides a wearable, real-time safety monitoring system that seamlessly integrates into the existing work gear of industrial workers, healthcare professionals, construction workers, retail staff, knowledge workers, and/or the labor force as a whole. In various embodiments, the system 40 effectively records and analyzes biometric and ergonomic data via analytics component 23 to help companies predict and prevent injuries, and/or create a personalized musculoskeletal injury prevention and rehabilitation plan. From the prevention perspective, the analytics component 23 can assist companies with site specific risk assessments, and can highlight which work sites cause the most injuries, which actions are high risk of injury, which job classifications have the highest risk of repetitive stress and musculoskeletal injuries. The analytics component 23 can further assist in determining why these site, actions, and job classifications are susceptible to injuries. The analytics component 23 according to embodiments of the invention can provide a personalized recovery plan with an internal alert and recommendation system, so an injured worker can return to work quickly and safely with a reduced chance of re-injury. The analytics component 23 can also assist a company in reintegrating the recovering worker as quickly as possible. In various embodiments, a worker can install the insert device as noted above and include the appropriate company personnel such as occupational health and safety personnel in their community via admin component 21. Adding the workers management extends the capabilities of the present invention by letting management optimize the use of labor such as in the construction industry, for example. The system 40 can augment accident prevention by providing employees biofeedback and analytics from big data to assist in personalizing accident prevention programs and mitigating risks.

Exemplary Use Case: Real Estate Optimization

Typical commercial office space is considered to be 70% underutilized, which has significant economic and environmental impact. Significant effort goes into understanding how a company's space is being used to reduce costs and increase employee innovation, productivity, and efficiency. Currently, there is no one method that provides statistically significant results and requires cross-correlation which results in great expense, time, and change management. Related somewhat to the Occupational Health and Safety discussion above, real estate optimization can be supported by embodiments of the present invention. For example, the analytics component 23 of the present invention can allow a company to optimize its real estate portfolio by tracking space utilization and improve employee innovation, productivity, and efficiency by understanding what spaces are under and over utilized, when this occurs, and how the spaces are used. The resulting data also supports trend analysis, adjusting for regional differences and variations in workforce characteristics.

Exemplary Use Case: Emergency Response/First Responders

Following the typical installation process, it will be appreciated that embodiments of the present invention can track location based on global positioning systems (GPS), as well as via cellular, beacon or wireless technologies, and/or dead reckoning using the IMU. Embodiments of the invention can also provide biofeedback via analytics component 23 to mitigate the risk of repetitive stress injuries.

The system 40 according to embodiments of the present invention can reside both on an external/host computing device (e.g., 90 or 92) and on server 20. The host device version provides real time processing in support of biofeedback, communicates with the server-side system, and provides a user interface between the insoles, the system back-end, data visualization and insights, biofeedback, behavioral change tools, administrative functions, ecommerce, and groupware, for example. The system can manage data, security, privacy, enterprise resource and supply chain management, and includes the capability to learn, optimize, and improve through the application of artificial intelligence.

In various embodiments, the system 40 tracks and adjusts for any out of sync data between the left and right insoles, identifies the cause of the misalignment, and, if possible, corrects the misalignment and notifies the user of the misalignment and any resulting data quality issues. In various embodiments, the system 40 uses data collected from the inserts 100 to perform a full gait analysis; predict musculoskeletal issues such as, but not limited to, repetitive stress injuries; accelerate rehabilitation, improve wellness, track and improve performance, predict health and occupational safety risks; identify functionally fitting shoes; determine the need for emergency response such as alerting "911" services, caregivers, health-wellness-fitness professionals; calculate altitude, heading, and reference to determine location. In various embodiments, the virtual coach component 30 receives insole diagnostic data tracking its performance, optimizing data quality and acquisition, providing system alerts and recommendations with the ability to perform administrative functions in the background based on user input. In various embodiments, the system 40 stores data and analytics for all parameters regardless of the analytics in use and can retroactively generate historical results for newly introduced parameters. Further, the system 40 can learn the data presentation preferences of the user and, based on user goals and objectives, recommends data visualization options and insights to the user, including those in the system 40 library that are not currently being accessed by the user. When received by the system 40, the raw data is linked to the user's account, stored and processed through algorithms and made available to the user based on their personalized dashboard via admin component 21.

In various embodiments, the system 40 accesses the user's available data, available de-identified user base data, and available contextual data from database 33 to derive and share insights with the user. This can be at the request of the user or offered by the expert system to augment the user's awareness, diagnostic and treatment capabilities, and/or decision making. The system 40 emulates the diagnostic processes of HWF professional's skills in determining the need for and design of custom orthotics. The analytics component 23 uses the data collected by the insert 10 to determine the user's free motion, and the design component 27 then designs an orthotic to promote and optimize that free motion should it be needed, optimize muscle activation and muscle strength, and, over time, minimize the need for an orthotic, for example. The analytics component 23 can also integrate data from other sensors located on other parts of the body, such as via wearables 94, to improve the accuracy of its assessment and orthotic design and other predictive functions. In various embodiments, system 40 can produce an increasingly accurate musculoskeletal, biomechanical, and kinematic model of the user over time. The system 40 can then use these models, user historical data, user goals and objectives, and user base data to improve the accuracy and speed of its assessments, suggestions, predictions, and orthotic design. The system 40 can determine if, when, and by how much an orthotic should be redesigned based on the user's activity, shoe, physical changes, and muscle usage, for example. The system 40 can further determine if the user's shoes need to be replaced, predict risk of repetitive stress injuries and recommend mitigation strategies and optimize rehabilitation, exercise, and performance. The system 40 can further assess form and provide biofeedback during the activity such as running or weight training to improve user form, optimize performance, and reduce the risk of injury. This capability extends to rehabilitation such as with stroke, arthritis, dementia, and neurological and musculoskeletal damage, for example. In various embodiments, the system can also identify stress/agitation such as in autistic individuals and alerts them so that they can perform de-stressing routines.

The system 40 can further recommend a form/style best suited to the user or assist the user in optimizing the user's form/style to a desired form/style. This applies to foot-related activities, whether cycling, running, football, climbing a ladder, weight training, work, rehabilitation, and other activities. For example, the system 40 can recommend a runner use the pose style or help a runner optimize the user's form to the pose style. The system 40 can continuously assess the risk of injury and the capacity and capability for achieving maximum performance and make recommendations to the user during and after the event. The system 40 can identify functionally fitting shoes and determine changes in the user's orthotic to expand the range of functionally fitting shoes, and can also measure orthotic-shoe performance and notify the user when to replace the shoe and or orthotic. The system 40 can augment diagnostic and treatment capabilities by assessing a user's historical data collected by the invention, accessing available de-identified data of a professional's patient/client base, accessing available de-identified data of patients/clients within the HWF and OH&S systems supporting the professional, and accessing de-identified data made available by users of the invention.

In various embodiments, the system 40 also recommends alternate goals/objectives based on the user's history, capacity, capability, and progress restructuring the user's experience and motivators. In various embodiments, the system 40 designs and manufactures a custom orthotic based on data collected from an insole without any required human intervention, including recommending construction parameters, such as a modular consistency, of a device to be produced, and/or creating an electronic file with such recommended construction parameters. The data can be processed by software to produce a 3D printable file of the custom orthotic that may be transmitted to the most convenient and/or suitable manufacturing device for creation.

It will thus be appreciated that, among other things, the present invention can include one or more digital libraries containing data representations facilitating embodiments of the present invention as described herein. For instance, certain digital libraries can assist with system optimization, HID creation, HID object selection, simulation, evaluation, object modification and digital materialization.

Specifically, a user profile digital library can provide demographic, biometric and biomechanical data, for example. An idealized form library can provide data on top performance, zero RSI risk, and may not necessarily be personalized to the user. A preferred form library can provide data on a personalized idealized form and optimized free motion, for example. An actual form library can provide continuous data represented by the root and calculated parameters. A community library can provide data regarding a user-created network. A scraping library can provide web harvesting and data extraction, for example. A HWF library can provide quantification of qualitative data, observations and measurements, for example. An external feedback library can quantify user/third party qualitative data, observations and measurements. A biofeedback library can provide user, system and HWF defined notification thresholds providing real time feedback and alerts. A user feedback library can provide quantification of qualitative data, observations and user measurements, for example. An activity profile library can provide a collection of signatures defining different activities, for example. An environmental library can provide climate, topography and surface conditions of the user's immediate surroundings, for example.

A neurology library can provide data on nervous system performance, for example. A physiology library can provide data on biological systems, such as respiratory, cardiovascular and blood chemistry, for example. A physiological model library can define user physiological models, such as, oxygenation, blood chemistry, neurological, cardiovascular, muscle activation and respiratory performance, for example. A kinematic models library can define a user's motion, and a biomechanical models library can define a user's musculoskeletal structure, for example. A results library can provide data related to a given activity such as a sport, work or recreation, for example. A digital materialization (DM) library can provide a solve process incorporating materials, shape, behavior and manufacturing data, for example. A sensor data library can include data collected from wearable devices, such as orientation, force, biometric data and neurological data, for example. A parameters library can provide values directly or indirectly derived from data where indirectly derived data comes from a combination of directly derived values.

An analytics library can provide algorithms using a set of parameters to provide information and insights such as gait analysis, injury prevention, RSI prediction, diagnosis, treatment, rehabilitation, performance optimization, emotional state, and processes, for example. A virtual coach library can provide recommendations to users on one or more optimal paths to objectives and mitigation of risks, including the collection of boundaries to define the acceptable range of a given activity or objective (e.g., RSI risk reduction, diagnostics, treatment, rehabilitation, stress management, performance optimization). A materials library can provide a collection of properties associated with specific material-structure combinations. A shape library can provide contour data related to an object, for example. A behavior library can provide predicted performance of a digital materialization and/or dynamic digital materialization object for a scenario, including instructions for adapting a device, for example. A manufacturing and distribution library can provide details on tool capabilities and constraints, locations and availability of manufacturing resources, cost and time data and user location data, for example.

It will be appreciated that all of the disclosed methods, analytics, and procedures described herein can be implemented using one or more processing devices, computer programs or components, such as the server in FIG. 1. These components may be provided as a series of computer instructions on any conventional computer-readable medium, including RAM, ROM, flash memory, magnetic or optical disks, optical memory, or other storage media. The instructions may be configured to be executed by one or more processors which, when executing the series of computer instructions, performs or facilitates the performance of all or part of the disclosed methods, analytics, and procedures.

Unless otherwise stated, devices or components of the present invention that are in communication with each other do not need to be in continuous communication with each other. Further, devices or components in communication with other devices or components can communicate directly or indirectly through one or more intermediate devices, components or other intermediaries. Further, descriptions of embodiments of the present invention herein wherein several devices and/or components are described as being in communication with one another does not imply that all such components are required, or that each of the disclosed components must communicate with every other component. In addition, while algorithms, process steps and/or method steps may be described in a sequential order, such approaches can be configured to work in different orders. In other words, any ordering of steps described herein does not, standing alone, dictate that the steps be performed in that order. The steps associated with methods and/or processes as described herein can be performed in any order practical. Additionally, some steps can be performed simultaneously or substantially simultaneously despite being described or implied as occurring non-simultaneously.

It will be appreciated that algorithms, method steps and process steps described herein can be implemented by appropriately programmed general purpose computers and computing devices, for example. In this regard, a processor (e.g., a microprocessor or controller device) receives instructions from a memory or like storage device that contains and/or stores the instructions, and the processor executes those instructions, thereby performing a process defined by those instructions. Further, programs that implement such methods and algorithms can be stored and transmitted using a variety of known media. At a minimum, the memory includes at least one set of instructions that is either permanently or temporarily stored. The processor executes the instructions that are stored in order to process data. The set of instructions can include various instructions that perform a particular task or tasks. Such a set of instructions for performing a particular task can be characterized as a program, software program, software, engine, module, component, mechanism, or tool. Common forms of computer-readable media that may be used in the performance of the present invention include, but are not limited to, floppy disks, flexible disks, hard disks, magnetic tape, any other magnetic medium, CD-ROMs, DVDs, any other optical medium, punch cards, paper tape, any other physical medium with patterns of holes, RAM, PROM, EPROM, FLASH-EEPROM, any other memory chip or cartridge, or any other medium from which a computer can read. The term "computer-readable medium" when used in the present disclosure can refer to any medium that participates in providing data (e.g., instructions) that may be read by a computer, a processor or a like device. Such a medium can exist in many forms, including, for example, non-volatile media, volatile media, and transmission media. Non-volatile media include, for example, optical or magnetic disks and other persistent memory. Volatile media can include dynamic random access memory (DRAM), which typically constitutes the main memory. Transmission media may include coaxial cables, copper wire and fiber optics, including the wires or other pathways that comprise a system bus coupled to the processor. Transmission media may include or convey acoustic waves, light waves and electromagnetic emissions, such as those generated during radio frequency (RF) and infrared (IR) data communications.

Various forms of computer readable media may be involved in carrying sequences of instructions associated with the present invention to a processor. For example, sequences of instruction can be delivered from RAM to a processor, carried over a wireless transmission medium, and/or formatted according to numerous formats, standards or protocols, such as Transmission Control Protocol/Internet Protocol (TCP/IP), Wi-Fi, Bluetooth, GSM, CDMA, EDGE and EVDO. Where databases are described in the present disclosure, it will be appreciated that alternative database structures to those described, as well as other memory structures besides databases may be readily employed. The drawing figure representations and accompanying descriptions of any exemplary databases presented herein are illustrative and not restrictive arrangements for stored representations of data. Further, any exemplary entries of tables and parameter data represent example information only, and, despite any depiction of the databases as tables, other formats (including relational databases, object-based models and/or distributed databases) can be used to store, process and otherwise manipulate the data types described herein. Electronic storage can be local or remote storage, as will be understood to those skilled in the art. Appropriate encryption and other security methodologies can also be employed by the system of the present invention, as will be understood to one of ordinary skill in the art.

The invention may be embodied in other specific forms without departing from the spirit or essential characteristics thereof. The present embodiments are therefore to be considered in all respects as illustrative and not restrictive, the scope of the invention being indicated by the claims of the application rather than by the foregoing description, and all changes which come within the meaning and range of equivalency of the claims are therefore intended to be embraced therein.

The invention claimed is:

1. A system for sequential device development, comprising:
    one or more sensors mounted to a body element, with the one or more sensors comprising at least a battery, a transceiver and an antenna array;
    an e-system in wired or wireless communication with the one or more sensors, and configured to perform signal processing, control processing and remote device communication;
    a first device of a first type secured to the body element; and
    a remote device comprising at least one processor and memory storing instructions, executable by the processor, to:
        receive data defining at least a first characteristic of the first device of the first type from the one or more sensors via the e-system;
        search one or more digital libraries, based on the received data, for at least a shape characteristic associated with the first device of the first type;
        simulate, based on the received data defining at least a first characteristic, at least one first change in the shape characteristic;
        generate a design for a second device of the first type based on the simulated at least one first change in the shape characteristic;
        receive data defining at least the first characteristic of the first device of the first type from the one or more digital libraries, wherein the data defining at least the first characteristic is not received from the one or more sensors;
        simulate, based on the received data defining at least the first characteristic from the one or more digital libraries, at least one second change in the shape characteristic; and
        generate a design for a third device of the first type based on the simulated at least one second change in the shape characteristic.

2. The system of claim 1, wherein the one or more sensors further comprise a signal control processor.

3. The system of claim 1, wherein the one or more sensors further comprise an inertial measurement unit.

4. The system of claim 1, wherein the data defining at least the first characteristic that is not received from the one or more sensors comprises historical data of a user of the first device.

5. The system of claim 1, further comprising a manufacturing device for generating the third device based on the generated design.

6. The system of claim 5, wherein the manufacturing device comprises an additive manufacturing component.

7. The system of claim 1, further comprising a manufacturing device for modifying the first device based on the generated design.

8. The system of claim 7, wherein the manufacturing device comprises a subtractive manufacturing component.

9. A custom device design system, comprising:
    a body element having an outer surface and formed with at least one body element e-system embedded therein, wherein the at least one body element e-system comprises at least one micro controller unit (MCU), a memory, wireless transceiver, inertial measurement system (IMU), and a battery;
    a radar sensor subsystem communicatively coupled to the body element;
    a first device of a first type secured to the body element outer surface; and
    a remote device comprising at least one processor and memory storing instructions, executable by the processor, to:
        receive data defining characteristics of the device of the first type, wherein the data is received from the radar sensor subsystem;
        search one or more digital libraries, based on the received data, for a shape characteristic and a material constituency characteristic associated with a device of a second type;
        simulate, based on the received data, one or more changes in the shape characteristic and one or more changes in the material constituency characteristic of the device of the second type; and
        generate a design for a second device of the first type based on the simulated changes and the received data, wherein the design comprises manufacturing or modifying instructions and object design characteristics, wherein the object design characteristics comprise at least one of the simulated changes in the shape characteristic or in the material constituency characteristic of the device of the second type.

10. The system of claim 9, further comprising a manufacturing device for generating the second device of the first type based on the generated design.

11. The system of claim 10, wherein the manufacturing device comprises an additive manufacturing component.

12. The system of claim 10, wherein the manufacturing device comprises a subtractive manufacturing component.

13. A custom device design system, comprising:
a first body element having an outer surface and formed with at least one first body element e-system embedded therein, wherein the at least one first body element e-system comprises at least one micro controller unit (MCU), a memory, wireless transceiver, inertial measurement system (IMU), and a battery;
a radar sensor subsystem communicatively coupled to the first body element;
a first device of a first type secured to the first body element outer surface; and
a remote device comprising at least one processor and memory storing instructions, executable by the processor, to:
receive first data defining characteristics of the first device of the first type, wherein the first data is received from the radar sensor subsystem;
search one or more digital libraries, based on the received first data, for a shape characteristic and a material constituency characteristic associated with the first device of the first type;
simulate, based on the received first data, one or more changes in the shape characteristic and one or more changes in the material constituency characteristic associated with the first device of the first type; and
generate a first design for a second device of the first type based on the simulated changes and the received first data, wherein the design comprises manufacturing or modifying instructions and object design characteristics, wherein the object design characteristics comprise at least one of the simulated changes in the shape characteristic or in the material constituency characteristic associated with the first device of the first type.

14. The system of claim 13, further comprising:
a second body element having an outer surface and formed with at least one second body element e-system embedded therein, wherein the at least one second body element e-system comprises at least one micro controller unit (MCU), a memory, wireless transceiver, inertial measurement system (IMU), and a battery;
a first device of a second type secured to the second body element outer surface; and
wherein the remote device stores instructions, executable by the processor, to:
receive second data defining characteristics of the first device of the second type;
search one or more digital libraries, based on the received second data, for a shape characteristic and a material constituency characteristic associated with the first device of the second type;
simulate, based on the received second data, one or more changes in the shape characteristic and one or more changes in the material constituency characteristic associated with the first device of the second type; and
generate a second design for a second device of the second type based on the simulated changes and the received second data, wherein the design comprises manufacturing or modifying instructions and object design characteristics, wherein the object design characteristics comprise at least one of the simulated changes in the shape characteristic or in the material constituency characteristic associated with the first device of the second type.

15. The system of claim 14, further comprising a manufacturing device for generating the second device of the first type based on the generated first design, and for generating the second device of the second type based on the generated second design.

16. The system of claim 15, wherein the manufacturing device comprises an additive manufacturing component.

17. The system of claim 15, wherein the manufacturing device comprises a subtractive manufacturing component.

18. A method for producing an orthotic device, comprising:
providing a body element with at least one body element e-system having at least one electronic sensor;
electronically receiving, by a computer system, data defining characteristics of an orthotic device to be formed, wherein the data is received from the at least one electronic sensor;
searching one or more digital libraries, based on the received data, for a shape characteristic and a material constituency characteristic associated with the orthotic device;
simulating, by the computer system and based on the received data, one or more changes in the shape characteristic and one or more changes in the material constituency characteristic of the orthotic device;
generating an orthotic device based on at least one of the simulated changes in the shape characteristic or in the material constituency characteristic.

19. An orthotic manufacturing system, comprising:
one or more sensors mounted to a body element, with the one or more sensors comprising at least a battery, a transceiver and an antenna array;
an e-system in wired or wireless communication with the one or more sensors, and configured to perform signal processing, control processing and remote device communication;
a remote device comprising at least one processor and memory storing instructions, executable by the processor, to:
receive data defining characteristics of an orthotic device to be formed, wherein the data is received from the one or more sensors via the e-system;
search one or more digital libraries, based on the received data, for a shape characteristic and a material constituency characteristic associated with the orthotic device;
simulate, based on the received data, one or more changes in the shape characteristic and one or more changes in the material constituency characteristic of the orthotic device; and
generate an orthotic device based on the simulated one or more changes in the shape characteristic or the material constituency characteristic.

* * * * *